United States Patent
Varadarajan et al.

(10) Patent No.: US 8,465,991 B2
(45) Date of Patent: Jun. 18, 2013

(54) CARBON CONTAINING LOW-K DIELECTRIC CONSTANT RECOVERY USING UV TREATMENT

(75) Inventors: Bhadri N. Varadarajan, Beaverton, OR (US); Kevin M. McLaughlin, Sherwood, OR (US); Bart van Schravendijk, Sunnyvale, CA (US)

(73) Assignee: Novellus Systems, Inc., Fremont, CA (US)

( * ) Notice: Subject to any disclaimer, the term of this patent is extended or adjusted under 35 U.S.C. 154(b) by 25 days.

(21) Appl. No.: 12/973,549

(22) Filed: Dec. 20, 2010

(65) Prior Publication Data

US 2011/0117678 A1    May 19, 2011

Related U.S. Application Data

(60) Continuation-in-part of application No. 12/940,324, filed on Nov. 5, 2010, which is a division of application No. 11/590,661, filed on Oct. 30, 2006, now Pat. No. 7,851,232.

(51) Int. Cl.
*H01L 21/3105* (2006.01)
*H01L 21/67* (2006.01)
*H01L 21/768* (2006.01)

(52) U.S. Cl.
USPC ............... 438/4; 438/623; 438/781; 438/795

(58) Field of Classification Search
USPC ............ 438/4, 618, 622, 623, 707, 710, 780, 438/781, 782, 798, FOR. 135, FOR. 388, 438/FOR. 395, 795; 257/E21.328, E21.33, 257/E21.579, E23.194
See application file for complete search history.

(56) References Cited

U.S. PATENT DOCUMENTS

| | | | |
|---|---|---|---|
| 3,983,385 | A | 9/1976 | Troue |
| 4,313,969 | A | 2/1982 | Matthews et al. |
| 4,357,451 | A | 11/1982 | McDaniel |
| 4,391,663 | A | 7/1983 | Hutter, III |
| 4,563,589 | A | 1/1986 | Scheffer |
| 4,751,191 | A | 6/1988 | Gonslorawski et al. |
| 4,837,289 | A | 6/1989 | Mueller et al. |
| 4,885,262 | A | 12/1989 | Ting et al. |

(Continued)

FOREIGN PATENT DOCUMENTS

| JP | 62-229833 | 10/1987 |
|---|---|---|
| JP | 01-107519 | 4/1989 |

(Continued)

OTHER PUBLICATIONS

U.S. Appl. No. 11/977,792, Office Action mailed Oct. 24, 2011.

(Continued)

*Primary Examiner* — Olik Chaudhuri
*Assistant Examiner* — Quovaunda V Jefferson
(74) *Attorney, Agent, or Firm* — Weaver Austin Villeneuve & Sampson LLP

(57) ABSTRACT

A method for the ultraviolet (UV) treatment of carbon-containing low-k dielectric and associated apparatus enables process induced damage repair. The methods of the invention are particularly applicable in the context of damascene processing to recover lost low-k property of a dielectric damaged during processing, either pre-metallization, post-planarization, or both. UV treatments can include an exposure of the subject low-k dielectric to a constrained UV spectral profile and/or chemical silylating agent, or both.

20 Claims, 7 Drawing Sheets

U.S. PATENT DOCUMENTS

| | | | |
|---|---|---|---|
| 5,174,881 A | 12/1992 | Iwasaki et al. | |
| 5,178,682 A | 1/1993 | Tsukamoto et al. | |
| 5,249,076 A * | 9/1993 | Fujiwara et al. | 359/350 |
| 5,268,320 A | 12/1993 | Holler et al. | |
| 5,282,121 A | 1/1994 | Bornhorst et al. | |
| 5,288,684 A | 2/1994 | Yamazaki et al. | |
| 5,298,939 A | 3/1994 | Swanson et al. | |
| 5,364,667 A | 11/1994 | Rhieu | |
| 5,413,664 A | 5/1995 | Yagi et al. | |
| 5,504,042 A | 4/1996 | Cho et al. | |
| 5,552,927 A | 9/1996 | Wheatly et al. | |
| 5,582,880 A | 12/1996 | Mochizuki et al. | |
| 5,667,592 A | 9/1997 | Boitnott et al. | |
| 5,686,054 A | 11/1997 | Barthel et al. | |
| 5,700,844 A | 12/1997 | Hedrick et al. | |
| 5,734,187 A * | 3/1998 | Bohr et al. | 257/377 |
| 5,789,027 A | 8/1998 | Watkins et al. | |
| 5,812,403 A | 9/1998 | Fong et al. | |
| 5,840,600 A | 11/1998 | Yamazaki et al. | |
| 5,851,715 A | 12/1998 | Barthel et al. | |
| 5,858,457 A | 1/1999 | Brinker et al. | |
| 5,876,798 A | 3/1999 | Vassiliev | |
| 5,877,095 A | 3/1999 | Tamura et al. | |
| 6,015,503 A | 1/2000 | Butterbaugh et al. | |
| 6,090,442 A | 7/2000 | Klaus et al. | |
| 6,098,637 A | 8/2000 | Parke | |
| 6,132,814 A | 10/2000 | Livesay et al. | |
| 6,136,680 A | 10/2000 | Lai et al. | |
| 6,140,252 A | 10/2000 | Cho et al. | |
| 6,150,272 A | 11/2000 | Liu et al. | |
| 6,228,563 B1 | 5/2001 | Starov et al. | |
| 6,232,248 B1 | 5/2001 | Shinriki et al. | |
| 6,254,689 B1 | 7/2001 | Meder | |
| 6,268,288 B1 | 7/2001 | Hautala et al. | |
| 6,270,846 B1 | 8/2001 | Brinker et al. | |
| 6,271,273 B1 | 8/2001 | You et al. | |
| 6,280,171 B1 | 8/2001 | Buazza | |
| 6,284,050 B1 | 9/2001 | Shi et al. | |
| 6,290,589 B1 | 9/2001 | Tolles | |
| 6,329,017 B1 | 12/2001 | Liu et al. | |
| 6,329,062 B1 | 12/2001 | Gaynor | |
| 6,333,268 B1 | 12/2001 | Starov et al. | |
| 6,340,628 B1 | 1/2002 | Van Cleemput et al. | |
| 6,348,407 B1 | 2/2002 | Gupta et al. | |
| 6,365,266 B1 | 4/2002 | MacDougall et al. | |
| 6,367,412 B1 | 4/2002 | Ramaswarry et al. | |
| 6,383,466 B1 | 5/2002 | Domansky et al. | |
| 6,383,955 B1 | 5/2002 | Matsuki et al. | |
| 6,386,466 B1 | 5/2002 | Ozawa et al. | |
| 6,387,453 B1 | 5/2002 | Brinker et al. | |
| 6,391,932 B1 | 5/2002 | Gore et al. | |
| 6,392,017 B1 | 5/2002 | Chandrashekar | |
| 6,394,797 B1 | 5/2002 | Sugaya et al. | |
| 6,399,212 B1 | 6/2002 | Sakai et al. | |
| 6,407,007 B1 | 6/2002 | Tsan et al. | |
| 6,420,441 B1 | 7/2002 | Allen et al. | |
| 6,444,715 B1 | 9/2002 | Mukherjee et al. | |
| 6,467,491 B1 | 10/2002 | Sugiura et al. | |
| 6,475,854 B2 | 11/2002 | Narwankar et al. | |
| 6,479,374 B1 | 11/2002 | Ioka et al. | |
| 6,479,409 B2 | 11/2002 | Shioya et al. | |
| 6,485,599 B1 | 11/2002 | Glownia et al. | |
| 6,518,130 B1 | 2/2003 | Ohno | |
| 6,531,193 B2 | 3/2003 | Fonash et al. | |
| 6,534,395 B2 | 3/2003 | Werkhoven et al. | |
| 6,548,113 B1 | 4/2003 | Birnbaum et al. | |
| 6,558,755 B2 | 5/2003 | Berry et al. | |
| 6,563,092 B2 | 5/2003 | Shrinivasan et al. | |
| 6,566,278 B1 * | 5/2003 | Harvey et al. | 438/778 |
| 6,576,300 B1 | 6/2003 | Berry et al. | |
| 6,596,654 B1 | 7/2003 | Bayman et al. | |
| 6,635,575 B1 | 10/2003 | Xia et al. | |
| 6,644,786 B1 | 11/2003 | Leben | |
| 6,677,251 B1 | 1/2004 | Lu et al. | |
| 6,740,602 B1 | 5/2004 | Hendriks et al. | |
| 6,740,605 B1 | 5/2004 | Shiraiwa et al. | |
| 6,756,085 B2 | 6/2004 | Waldfried et al. | |
| 6,759,098 B2 | 7/2004 | Han et al. | |
| 6,770,866 B2 | 8/2004 | Retschke et al. | |
| 6,797,643 B2 | 9/2004 | Rocha-Alvarez et al. | |
| 6,800,546 B2 | 10/2004 | Konishi et al. | |
| 6,805,801 B1 | 10/2004 | Humayun et al. | |
| 6,812,043 B2 | 11/2004 | Bao et al. | |
| 6,821,906 B2 | 11/2004 | Wada et al. | |
| 6,830,624 B2 | 12/2004 | Janakiraman et al. | |
| 6,831,284 B2 | 12/2004 | Demos et al. | |
| 6,835,417 B2 | 12/2004 | Saenger et al. | |
| 6,848,458 B1 | 2/2005 | Shrinivasan et al. | |
| 6,856,712 B2 | 2/2005 | Fauver et al. | |
| 6,884,738 B2 | 4/2005 | Asai et al. | |
| 6,899,857 B2 | 5/2005 | Pheng et al. | |
| 6,902,440 B2 | 6/2005 | Dougan et al. | |
| 6,921,727 B2 | 7/2005 | Chiang et al. | |
| 6,958,301 B2 | 10/2005 | Kim et al. | |
| 6,967,160 B1 | 11/2005 | Paton et al. | |
| 7,005,390 B2 | 2/2006 | Ramachandrarao et al. | |
| 7,017,514 B1 | 3/2006 | Shepherd et al. | |
| 7,018,918 B2 | 3/2006 | Kloster et al. | |
| 7,025,831 B1 | 4/2006 | Butterbaugh et al. | |
| 7,030,041 B2 | 4/2006 | Li et al. | |
| 7,094,713 B1 | 8/2006 | Niu et al. | |
| 7,097,712 B1 | 8/2006 | Yamazaki et al. | |
| 7,112,541 B2 | 9/2006 | Xia et al. | |
| 7,132,334 B2 | 11/2006 | Lin | |
| 7,144,606 B2 | 12/2006 | Huang | |
| 7,148,155 B1 | 12/2006 | Tarafdar et al. | |
| 7,166,531 B1 | 1/2007 | van den Hoek et al. | |
| 7,176,144 B1 | 2/2007 | Wang et al. | |
| 7,195,548 B1 | 3/2007 | Hardikar et al. | |
| 7,208,389 B1 | 4/2007 | Tipton et al. | |
| 7,235,459 B2 | 6/2007 | Sandhu | |
| 7,241,704 B1 | 7/2007 | Wu et al. | |
| 7,244,672 B2 | 7/2007 | Nguyen et al. | |
| 7,247,582 B2 | 7/2007 | Stern et al. | |
| 7,253,125 B1 | 8/2007 | Bandyopadhyay et al. | |
| 7,256,111 B2 | 8/2007 | Lopatin et al. | |
| 7,265,061 B1 | 9/2007 | Cho et al. | |
| 7,304,302 B1 | 12/2007 | Nunan et al. | |
| 7,332,445 B2 | 2/2008 | Lukas et al. | |
| 7,381,659 B2 | 6/2008 | Nguyen et al. | |
| 7,390,537 B1 | 6/2008 | Wu et al. | |
| 7,394,067 B1 | 7/2008 | Soltz et al. | |
| 7,402,532 B2 | 7/2008 | Clevenger et al. | |
| 7,481,882 B2 | 1/2009 | Won et al. | |
| 7,504,663 B2 | 3/2009 | Yamazaki et al. | |
| 7,510,982 B1 | 3/2009 | Draeger et al. | |
| 7,611,757 B1 | 11/2009 | Bandyopadhyay et al. | |
| 7,622,162 B1 | 11/2009 | Schravendijk et al. | |
| 7,705,431 B1 | 4/2010 | Sanganeria et al. | |
| 7,790,633 B1 | 9/2010 | Tarafdar et al. | |
| 7,851,232 B2 | 12/2010 | van Schravendijk et al. | |
| 7,858,533 B2 | 12/2010 | Liu et al. | |
| 7,906,174 B1 | 3/2011 | Wu et al. | |
| 8,043,667 B1 | 10/2011 | Bandyopadhyay et al. | |
| 8,062,983 B1 | 11/2011 | Draeger et al. | |
| 8,211,510 B1 | 7/2012 | Varadarajan et al. | |
| 8,242,028 B1 | 8/2012 | Van Schravendijk et al. | |
| 2001/0001501 A1 | 5/2001 | Lee et al. | |
| 2001/0014512 A1 | 8/2001 | Lyons et al. | |
| 2002/0001973 A1 | 1/2002 | Wu et al. | |
| 2002/0015850 A1 * | 2/2002 | Nakamura et al. | 428/447 |
| 2002/0016085 A1 | 2/2002 | Huang et al. | |
| 2002/0034626 A1 | 3/2002 | Liu et al. | |
| 2002/0052124 A1 | 5/2002 | Raaijmakers et al. | |
| 2002/0064341 A1 | 5/2002 | Fauver et al. | |
| 2002/0106500 A1 | 8/2002 | Albano et al. | |
| 2002/0117109 A1 | 8/2002 | Hazelton et al. | |
| 2002/0123218 A1 | 9/2002 | Shioya et al. | |
| 2002/0123240 A1 | 9/2002 | Gallagher et al. | |
| 2002/0148563 A1 | 10/2002 | Carlson et al. | |
| 2002/0172766 A1 | 11/2002 | Laxman et al. | |
| 2002/0187627 A1 * | 12/2002 | Yuang | 438/622 |
| 2002/0195683 A1 | 12/2002 | Kim et al. | |
| 2003/0013280 A1 | 1/2003 | Yamanaka | |
| 2003/0015764 A1 | 1/2003 | Raaijmakers et al. | |
| 2003/0064604 A1 | 4/2003 | Umeda | |
| 2003/0064607 A1 | 4/2003 | Leu et al. | |

| | | |
|---|---|---|
| 2003/0068881 A1 | 4/2003 | Xia et al. |
| 2003/0134038 A1 | 7/2003 | Paranjpe |
| 2003/0157248 A1 | 8/2003 | Watkins et al. |
| 2003/0157267 A1 | 8/2003 | Waldfried et al. |
| 2003/0199603 A1 | 10/2003 | Walker et al. |
| 2003/0227087 A1* | 12/2003 | Kakamu et al. ............... 257/758 |
| 2003/0228769 A1 | 12/2003 | Chen et al. |
| 2003/0228770 A1 | 12/2003 | Lee et al. |
| 2004/0004247 A1 | 1/2004 | Forbes et al. |
| 2004/0018319 A1 | 1/2004 | Waldfried et al. |
| 2004/0022960 A1 | 2/2004 | Rhee et al. |
| 2004/0023513 A1 | 2/2004 | Aoyama et al. |
| 2004/0029391 A1 | 2/2004 | Kirkpatrick et al. |
| 2004/0033662 A1 | 2/2004 | Lee et al. |
| 2004/0058090 A1 | 3/2004 | Waldfried et al. |
| 2004/0062633 A1* | 4/2004 | Rice et al. ....................... 414/935 |
| 2004/0069410 A1 | 4/2004 | Moghadam et al. |
| 2004/0072405 A1* | 4/2004 | Yao et al. ....................... 438/393 |
| 2004/0082163 A1 | 4/2004 | Mori et al. |
| 2004/0096593 A1 | 5/2004 | Lukas et al. |
| 2004/0096672 A1 | 5/2004 | Lukas et al. |
| 2004/0099915 A1 | 5/2004 | Takayama et al. |
| 2004/0099952 A1 | 5/2004 | Goodner et al. |
| 2004/0101633 A1 | 5/2004 | Zheng et al. |
| 2004/0102031 A1 | 5/2004 | Kloster et al. |
| 2004/0115933 A1 | 6/2004 | Jung et al. |
| 2004/0152239 A1 | 8/2004 | Bao et al. |
| 2004/0166240 A1 | 8/2004 | Rhee et al. |
| 2004/0175501 A1* | 9/2004 | Lukas et al. ............. 427/255.28 |
| 2004/0175957 A1 | 9/2004 | Lukas et al. |
| 2004/0185679 A1 | 9/2004 | Ott et al. |
| 2004/0221871 A1 | 11/2004 | Fletcher et al. |
| 2004/0224496 A1 | 11/2004 | Cui et al. |
| 2004/0266214 A1 | 12/2004 | Suguro et al. |
| 2005/0016687 A1 | 1/2005 | Shinriki et al. |
| 2005/0025892 A1 | 2/2005 | Satoh et al. |
| 2005/0026454 A1 | 2/2005 | Konishi et al. |
| 2005/0032293 A1* | 2/2005 | Clark et al. ..................... 438/222 |
| 2005/0064712 A1 | 3/2005 | Andreas |
| 2005/0064726 A1 | 3/2005 | Reid et al. |
| 2005/0079717 A1 | 4/2005 | Savas et al. |
| 2005/0095840 A1* | 5/2005 | Bhanap et al. ................. 438/623 |
| 2005/0101154 A1 | 5/2005 | Huang |
| 2005/0112282 A1 | 5/2005 | Gordon et al. |
| 2005/0153533 A1* | 7/2005 | Hoshino et al. ............... 438/618 |
| 2005/0156285 A1 | 7/2005 | Gates et al. |
| 2005/0161821 A1 | 7/2005 | Lee et al. |
| 2005/0164497 A1 | 7/2005 | Lopatin et al. |
| 2005/0170104 A1 | 8/2005 | Jung et al. |
| 2005/0191803 A1 | 9/2005 | Matsuse et al. |
| 2005/0194619 A1 | 9/2005 | Edelstein et al. |
| 2005/0208758 A1 | 9/2005 | Lu et al. |
| 2005/0233598 A1 | 10/2005 | Jung et al. |
| 2005/0260357 A1 | 11/2005 | Olsen et al. |
| 2005/0260420 A1 | 11/2005 | Collins et al. |
| 2005/0263719 A1 | 12/2005 | Ohdaira et al. |
| 2005/0272220 A1 | 12/2005 | Waldfried et al. |
| 2006/0024976 A1 | 2/2006 | Waldfried et al. |
| 2006/0027929 A1 | 2/2006 | Cooney et al. |
| 2006/0046516 A1 | 3/2006 | Weber |
| 2006/0063662 A1 | 3/2006 | Hata et al. |
| 2006/0105106 A1 | 5/2006 | Balseanu et al. |
| 2006/0110936 A1 | 5/2006 | Hill et al. |
| 2006/0118817 A1 | 6/2006 | Haisma |
| 2006/0121208 A1 | 6/2006 | Siegel |
| 2006/0141806 A1* | 6/2006 | Waldfried et al. ............. 438/778 |
| 2006/0142143 A1 | 6/2006 | Abrevaya et al. |
| 2006/0145304 A1 | 7/2006 | Boyanov et al. |
| 2006/0189133 A1 | 8/2006 | Dimitrakopoulos et al. |
| 2006/0216839 A1 | 9/2006 | Shenesh et al. |
| 2006/0220251 A1 | 10/2006 | Kloster |
| 2006/0246672 A1 | 11/2006 | Chen et al. |
| 2006/0260538 A1 | 11/2006 | Ye et al. |
| 2006/0265868 A1 | 11/2006 | Rueger et al. |
| 2006/0269693 A1 | 11/2006 | Balseanu et al. |
| 2007/0015355 A1 | 1/2007 | Lin et al. |
| 2007/0032024 A1 | 2/2007 | Peidous et al. |
| 2007/0042581 A1 | 2/2007 | Sano et al. |
| 2007/0054504 A1 | 3/2007 | Chen et al. |
| 2007/0065578 A1 | 3/2007 | McDougall |
| 2007/0105292 A1 | 5/2007 | Chen et al. |
| 2007/0132054 A1 | 6/2007 | Arghavani et al. |
| 2007/0134821 A1 | 6/2007 | Thakur et al. |
| 2007/0134907 A1 | 6/2007 | Ikeda et al. |
| 2007/0161230 A1 | 7/2007 | Chen et al. |
| 2007/0189961 A1 | 8/2007 | Iacopi et al. |
| 2007/0196011 A1 | 8/2007 | Cox et al. |
| 2007/0207624 A1 | 9/2007 | Chua |
| 2007/0215377 A1 | 9/2007 | Aoki |
| 2007/0222081 A1 | 9/2007 | Chen et al. |
| 2007/0224824 A1 | 9/2007 | Chen et al. |
| 2007/0228570 A1 | 10/2007 | Dimitrakopoulos et al. |
| 2007/0275569 A1 | 11/2007 | Moghadam et al. |
| 2007/0281497 A1 | 12/2007 | Liu et al. |
| 2007/0287240 A1 | 12/2007 | Chen et al. |
| 2008/0009141 A1 | 1/2008 | Dubois et al. |
| 2008/0020591 A1 | 1/2008 | Balseanu et al. |
| 2008/0026579 A1 | 1/2008 | Lai et al. |
| 2008/0132055 A1 | 6/2008 | Nguyen et al. |
| 2008/0199977 A1 | 8/2008 | Weigel et al. |
| 2008/0254643 A1 | 10/2008 | Clevenger et al. |
| 2008/0286697 A1 | 11/2008 | Verhaverbeke et al. |
| 2008/0305600 A1 | 12/2008 | Liao et al. |
| 2008/0318437 A1 | 12/2008 | Kim et al. |
| 2008/0318438 A1* | 12/2008 | Nakamura et al. ............ 438/770 |
| 2009/0017640 A1 | 1/2009 | Huh et al. |
| 2009/0039475 A1 | 2/2009 | Shioya |
| 2009/0059406 A1 | 3/2009 | Powers et al. |
| 2009/0278116 A1 | 11/2009 | Yamate |
| 2010/0018460 A1 | 1/2010 | Singh et al. |
| 2010/0261349 A1 | 10/2010 | Van Schravendijk et al. |
| 2010/0267231 A1 | 10/2010 | Van Schravendijk et al. |
| 2010/0317198 A1 | 12/2010 | Antonelli et al. |
| 2011/0045610 A1 | 2/2011 | Van Schravendijk et al. |
| 2011/0111533 A1 | 5/2011 | Varadarajan et al. |
| 2011/0117678 A1 | 5/2011 | Varadarajan et al. |
| 2012/0061718 A1 | 3/2012 | Yamazaki et al. |

FOREIGN PATENT DOCUMENTS

| | | |
|---|---|---|
| JP | 09-306892 | 11/1997 |
| JP | 11214364 A | 8/1999 |
| JP | 2006165573 | 6/2006 |
| JP | 63-307740 | 12/2008 |
| KR | 2000-0043888 | 7/2000 |
| WO | 2006/104583 | 10/2006 |
| WO | 2006/127463 | 11/2006 |
| WO | 2007/043206 | 4/2007 |

OTHER PUBLICATIONS

U.S. Appl. No. 10/972,084, Office Action mailed Oct. 27, 2011.
U.S. Appl. No. 11/656,661, Final Office Action mailed Nov. 10, 2011.
U.S. Appl. No. 11/731,581, Office Action mailed Nov. 28, 2011.
U.S. Appl. No. 11/115,576, Notice of Allowance mailed Nov. 14, 2011.
U.S. Appl. No. 12/210,060, Office Action mailed Nov. 28, 2011.
U.S. Appl. No. 12/940,324, Office Action mailed Dec. 13, 2011.
Cho et al., "Plasma Treatments of Molecularly Templated Nanoporous Silica Films," Electrochemical and Solid-State Letters, 4 (4) G35-G38 (2001).
Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.
Schulberg et al., "System for Deposition of Mesoporous Materials," U.S. Appl. No. 10/295,965, filed Nov. 15, 2002, 64 Pages.
Watkins et al., "Mesoporous Materials and Methods," U.S. Appl. No. 10/301,013, filed Nov. 21, 2002, 34 Pages.
Justin F. Gaynor, "In-Situ Treatment of Low-K Films With a Silylating Agent After Exposure to Oxidizing Environments," U.S. Appl. No. 10/056,926, filed Jan. 24, 2002, 34 Pages.
Jan, C.H., et al, *90NM Generation, 300mm Wafer Low k ILD/Cu Interconnect Technology*, 2003 IEEE Interconnect Technology Conference.
Gangpadhyay et al., "The First International Surface Cleaning Workshop," Northeastern University, Nov. 11-14, 2002.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

U.S. Office Action mailed Sep. 7, 2004, from U.S. Appl. No. 10/672,311.

U.S. Office Action mailed Dec. 28, 2004, from U.S. Appl. No. 10/672,311.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

U.S. Office Action mailed Mar. 2, 2005, from U.S. Appl. No. 10/860,340.

U.S. Final Office Action mailed Jun. 13, 2005, from U.S. Appl. No. 10/860,340.

Varadarajan et al., "Tensile Dielectric Films Using UV Curing", U.S. Appl. No. 10/972,084, filed Oct. 22, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Final Office Action mailed Jul. 13, 2005, from U.S. Appl. No. 10/672,311.

U.S. Office Action mailed Dec. 20, 2005, from U.S. Appl. No. 10/672,311.

U.S. Appl. No. 10/975,028, Office Action mailed Oct. 6, 2005.

U.S. Appl. No. 10/975,028, Office Action mailed Mar. 24, 2006.

U.S. Appl. No. 10/975,028, Notice of Allowance mailed May 8, 2006.

U.S. Office Action mailed Mar. 29, 2006, from U.S. Appl. No. 10/800,377.

Kelman et al., "Method for Reducing Stress in Porous Dielectric Films", U.S. Appl. No. 11/369,311, filed Mar. 6, 2006.

U.S. Office Action mailed Jun. 28, 2006, from U.S. Appl. No. 10/825,888.

U.S. Office Action mailed Dec. 27, 2006, from U.S. Appl. No. 10/825,888.

Cho et al., "Method and Apparatus for UV Exposure of Low Dielectric Constant Materials for Porogen Removal and Improved Mechanical Properties", Novellus Systems, Inc., U.S. Appl. No. 11/656,661, filed Jan. 22, 2007, pp. 1-28.

Kamian et al., "Ultra Violet Light Treatment Load Lock for Dielectric Films," Novellus Systems, Inc., U.S. Appl. No. 11/561,834, filed Nov. 20, 2006, pp. 1-25.

Schravendijk et al., "UV Treatment of Etch Stop and Hard Mask Films for Selectivity and Hermeticity Enhancement," Novellus Systems, Inc., U.S. Appl. No. 11/696,102, filed Apr. 3, 2007, pp. 1-22.

Vancouver et al., "PECVD Methods for Producing Ultra Low-K Dielectric Films Using UV Treatment," U.S. Appl. No. 11/608,056, filed Dec. 7, 2006, pp. 1-34.

Tarafdar et al., "Sequential Deposition/Anneal Film Densification Method", Novellus Systems, Inc., filed Sep. 11, 2006, U.S. Appl. No. 11/519,445.

Schravendijk, "UV Treatment of FSG Films to Improve Film Stability," Novellus Systems, Inc., U.S. Appl. No. 11/622,423, filed Jan. 11, 2007, pp. 1-31.

Arghavani et al., Strain Engineering in Non-Volatile Memories, *Reed Business Information*, 2007, six pages.

Notice of Allowance and Fee Due mailed May 22, 2006, from U.S Appl. No. 10/672,311.

Notice of Allowance and Fee Due mailed Apr. 4, 2007, from U.S Appl. No. 10/825,888.

Notice of Allowance and Fee Due mailed Oct. 10, 2006, from U.S Appl. No. 10/800,377.

U.S. Office Action mailed Nov. 28, 2007, from U.S Appl. No. 10/807,680.

R.J. Lewis, Sr., Hawley's Condensed Chemical Dictionary, $12^{th}$ Edition, Van Nostrad Reinhold Co., New York, 1993 (no month), excerpts pp. 916-918 & 1123-1124.

Notice of Allowance and Fee Due mailed Dec. 20, 2005, from U.S Appl. No. 10/860,340.

Shaviv et al., "UV Treatment to Improve Integrity and Performance of Front End Dielectrics," Novellus Systems, Inc., U.S Appl. No. 11/622,409, filed Jan. 11, 2007.

van Schravendijk et al., "UV Treatment for Carbon-Containing Low-K Dielectric Repair in Semiconductor Processing," Novellus Systems, Inc., U.S Appl. No. 11/590,661, filed Oct. 30, 2006.

Shrinivassan et al., "Multi-Station Sequential Curing of Dielectric Films," Novellus Systems, Inc., U.S Appl. No. 11/688,695, filed Mar. 20, 2007.

Varadarajan et al., "A Cascaded Cure Approach to Fabricate Highly Tensile Silicon Nitride Films," Novellus Systems, Inc., U.S Appl. No. 11/897,838, filed Aug. 31, 2007.

U.S. Office Action mailed Jan. 10, 2008, from U.S Appl. No. 11/622,423.

Bhadri Varadarajan et al., "Development of High Stress SiN Films for Use with Strained Silicon Technologies"; Proc. $68^{th}$ Symp. On Semiconductors and IC Tech.; Kyoto 2005.

U.S. Office Action mailed Apr. 3, 2008, from U.S Appl. No. 10/982,654.

U.S. Office Action mailed Sep. 19, 2008, from U.S Appl. No. 11/824,049.

U.S. Final Office Action mailed Jul. 10, 2008, from U.S Appl. No. 10/807,680.

U.S. Final Office Action mailed Jul. 9, 2008, from U.S Appl. No. 10/982,654.

U.S. Office Action mailed May 14, 2008, from U.S Appl. No. 11/519,445.

U.S. Office Action mailed Jul. 23, 2008, from U.S Appl. No. 11/622,423.

U.S Appl. No. 11/590,661, Office Action mailed Apr. 6, 2009.

U.S Appl. No. 11/811,048, Office Action mailed Mar. 19, 2009.

U.S Appl. No. 11/811,048, Notice of Allowance mailed Aug. 17, 2009.

U.S Appl. No. 11/811,048, Supplemental Notice of Allowance mailed Oct. 8, 2009.

Rodriquez, J.A. et al., "Evolution of the mechanical stress on PECVD silicon oxide films under thermal processing", Journal of Materials Science Letters 19, 2000, pp. 1399-1401.

U.S Appl. No. 11/824,049, Office Action mailed Mar. 19, 2009.

U.S Appl. No. 11/824,049, Notice of Allowance mailed Jun. 22, 2009.

U.S Appl. No. 10/982,654, Office Action mailed Dec. 4, 2008.

U.S Appl. No. 11/519,445, Office Action mailed Dec. 10, 2008.

U.S Appl. No. 10/972,084, Office Action mailed Dec. 30, 2008.

U.S Appl. No. 11/688,695, Office Action mailed Jun. 11, 2009.

U.S Appl. No. 11/696,102, Office Action mailed Jul. 1, 2009.

Yu, J.J. et al., "UV Annealing of Ultrathin Tantalum Oxide Films", Applied Surface Science, V 186 (2002), 57-63.

U.S Appl. No. 11/369,311, Office Action mailed Aug. 20, 2009.

U.S Appl. No. 11/608,056, Office Action mailed Aug. 20, 2009.

P. Morin et al., "Tensile contact etch stop layer for nMOS performance enhancement: influence of the film morphology", ECS meeting, May 2005.

Takagi et al., "High Rate Deposition of a-Si:H and a-SiN$_x$:H by VHF PECVD", Vacuum, 51, 1998.

Smith, D.L et al., "Mechanism of SiN$_3$-SiH$_4$ Llasma", J. Electrochem. Soc., vol. 137 (2) 1990.

Nagayoshi et al., "Residual Stress of a $Si_{1-x}N_x$: H Films Prepared by Afterglow Plasma Chemical Vapor Deposition Technique", Jpn. J. Appl. Phys. vol. 31 (1992) pp. L867-L869 Part 2, No. 7A, Jul. 1, 1992.

Varadarajan et al., "Use of VHF RF plasma to deposit high tensile stress films with improved film properties for use in strained silicon technology", U.S Appl. No. 11/975,473, filed Oct. 18, 2007.

U.S Appl. No. 11/975,473, Office Action mailed Oct. 28, 2008.

U.S Appl. No. 11/975,473, Office Action mailed Mar. 23, 2009.

Jiang et al., "Tensile dielectric films using UV curing", U.S Appl. No. 11/899,683, filed Sep. 7, 2007.

U.S Appl. No. 11/899,683, Office Action mailed May 29, 2009.

U.S Appl. No. 11/519,445, Office Action mailed Aug. 26, 2009.

U.S Appl. No. 11/622,409, Office Action mailed Jul. 1, 2009.

Haverkamp et al., "Enhancing adhesion of cap layer films", U.S Appl. No. 11/731,581, filed Mar. 30, 2007.
U.S Appl. No. 11/731,581, Office Action mailed Jun. 1, 2009.
U.S Appl. No. 11/975,473, Office Action mailed Oct. 9, 2009.
Bandyopadhyay et al., "Method to Improve Mechanical Strength of Low-K Dielectric Film Using Modulated UV Exposure," Novellus Systems, Inc., U.S Appl. No. 12/566,514, filed Sep. 24, 2009.
U.S Appl. No. 11/622,409, Office Action mailed Nov. 5, 2009.
U.S Appl. No. 11/519,445, Office Action mailed Nov. 4, 2009.
U.S Appl. No. 10/972,084, Office Action mailed Nov. 27, 2009.
Haverkamp, et al., "Multi-Station Sequential Curing of Dielectric Films," Novellus Systems, Inc., U.S Appl. No. 11/977,792, filed Oct. 25, 2007.
Haverkamp, et al., "Progressive UV Cure," Novellus Systems, Inc., U.S Appl. No. 12/210,060, filed Sep. 12, 2008.
U.S Appl. No. 11/696,102, Final Office Action mailed Dec. 22, 2009.
U.S Appl. No. 11/369,311, Office Action mailed Jan. 5, 2010.
U.S Appl. No. 11/688,695, Final Office Action mailed Dec. 31, 2009.
U.S Appl. No. 11/590,661, Final Office Action mailed Jan. 25, 2010.
U.S Appl. No. 11/656,661, Office Action mailed Jan. 22, 2010.
U.S Appl. No. 11/731,581, Office Action mailed Feb. 4, 2010.
U.S Appl. No. 11/899,683, Office Action mailed Feb. 8, 2010.
Wu, et al., "Methods for Fabricating Zeolite Nano-Crystal Based Low-K Dielectric Films Containing Si (CxHy)n Groups and Treating Films by Ultra-Violet Thermal Processing," Novellus Systems, Inc., U.S Appl. No. 12/172,089, filed Jul. 11, 2008.
U.S Appl. No. 11/977,792, Office Action mailed Mar. 9, 2010.
Chaabouni, H. et al., "Porous SiOCH Ultra Low-K recovery treatments after direct CMP process", Advanced Metallization Conference, Sep. 2008.
Chaabouni, H. et al., "Sidewall restoration of porous ultra low-$k$ dielectrics for sub-45 nm technology nodes", Microelectronic Engineering 84 (2007).
Huang, H. et al., "O2 Plasma Damage and Dielectric Recoveries to Patterned CDO Low-k Dielectrics", Advanced Metallization Conference, Sep. 2008.
U.S Appl. No. 11/608,056, Office Action mailed Mar. 23, 2010.
U.S Appl. No. 11/975,473, Office Action mailed Mar. 25, 2010.
Takagi et al., "High Rate Deposition of a-SiN$_x$:H by VHF PECVD", Mat. Res. Soc. Symp. Proc. vol. 467, 1997, Materials Research Society.
U.S Appl. No. 12/726,263, "Apparatus for UV damage repair of low K films prior to copper barrier deposition", van Schravendijk et al., filed Mar. 17, 2010.
U.S Appl. No. 11/519,445, Notice of Allowance mailed Apr. 21, 2010.
U.S Appl. No. 11/561,834, Office Action mailed May 21, 2010.
U.S Appl. No. 12/840,192, "Sequential deposition / anneal film densification method", Tarafdar et al., filed Jul. 20, 2010.
U.S Appl. No. 11/688,695, Office Action mailed Jul. 23, 2010.
U.S Appl. No. 11/590,661, Notice of Allowance mailed Aug. 6, 2010.
U.S Appl. No. 11/656,661, Final Office Action mailed Aug. 24, 2010.
U.S Appl. No. 12/172,089, Office Action mailed Sep. 13, 2010.
Li, Shuang et al., "Organic-functionalized pure-silica-zeolite MFI low-$k$ films", Chem. Mater. 2005, 17, Mar. 9, 2005, pp. 1851-1854.
U.S Appl. No. 11/731,581, Final Office Action mailed Sep. 2, 2010.
U.S Agpl. No. 10/972,084, Office Action mailed Oct. 15, 2010.
U.S Appl. No. 11/977,792, Office Action mailed Oct. 25, 2010.
U.S Appl. No. 11/975,473, Office Action mailed Nov. 1, 2010.
U.S Appl. No. 11/608,056, Notice of Allowance mailed Nov. 2, 2010.
U.S Appl. No. 12/566,514, Office Action mailed Jan. 11, 2011.
U.S Appl. No. 11/561,834, Final Office Action mailed Dec. 3, 2010.
U.S Appl. No. 11/696,102, Office Action mailed Jan. 26, 2011.
U.S Appl. No. 11/688,695, Office Action mailed Feb. 1, 2011.
U.S. Office Action mailed Dec. 12, 2007, from U.S Appl. No. 11/146,456.
U.S. Final Office Action mailed Jul. 25, 2008, from U.S Appl. No. 11/146,456.
U.S Appl. No. 11/146,456, Notice of Allowance mailed Nov. 10, 2008.
U.S Appl. No. 11/146,456, Supplemental Notice of Allowance mailed Dec. 15, 2008.
Draeger et al., "Creation of Porosity in Low-K Films by Photo-Disassociation of Imbedded Nanoparticles," U.S Appl. No. 12/369,384, filed Feb. 11, 2009.
U.S. Office Action mailed Feb. 22, 2011, from U.S Appl. No. 12/369,384.
U.S Appl. No. 11/369,311, Office Action mailed Apr. 13, 2011.
U.S Appl. No. 12/172,089, Final Office Action mailed Apr. 14, 2011.
U.S Appl. No. 10/972,084, Office Action mailed May 2, 2011.
U.S Appl. No. 11/656,661, Office Action mailed May 19, 2011.
U.S Appl. No. 11/731,581, Office Action mailed Jun. 2, 2011.
U.S Appl. No. 12/646,830, "UV and reducing treatment for K recovery and surface clean in semiconductor processing", Varadarajan et al., filed Dec. 23, 2009.
U.S Appl. No. 11/977,792, Office Action mailed Jul. 6, 2011.
U.S Appl. No. 11/897,838, Office Action mailed Jul. 11, 2011.
U.S Appl. No. 12/646,830, Office Action mailed Jul. 15, 2011.
Notice of Allowance for U.S Appl. No. 12/566,514, mailed Jul. 13, 2011.
Allowed Claims as of Jul. 13, 2011 for U.S Appl. No. 12/566,514.
U.S Appl. No. 11/696,102, Final Office Action mailed Aug. 11, 2011.
Notice of Allowance for U.S Appl. No. 12/369,384, mailed Aug. 19, 2011.
Allowed Claims as of Aug. 19, 2011 for U.S Appl. No. 12/369,384.
Korean Notification of Provisional Rejection mailed Dated Jul. 12, 2011 for Application No. 10-2010-0066153.
U.S Appl. No. 11/369,311, Final Office Action mailed Sep. 29, 2011.
U.S Appl. No. 12/646,830, Office Action mailed Jan. 11, 2012.
U.S Appl. No. 11/688,695, Office Action mailed Dec. 14, 2011.
U.S Appl. No. 12/840,192, Office Action mailed Feb. 6, 2012.
U.S Appl. No. 13/275,209, Office Action mailed Mar. 12, 2012.
U.S Appl. No. 11/369,311, Office Action mailed Mar. 7, 2012.
U.S Appl. No. 11/696,102, Notice of Allowance mailed Feb. 24, 2012.
U.S Appl. No. 11/897,838, Notice of Allowance mailed Mar. 2, 2012.
Deshmukh, et al., "Remote Plasma Etching Reactors: Modeling and Experiment," J. Vac. Sci. Technol., B 11(2), Mar./Apr. 1993, pp. 206-215.
SG patent application No. 2010079747, Examination Report mailed Apr. 25, 2012.
U.S Appl. No. 10/972,084, Office Action mailed May 1, 2012.
U.S Appl. No. 12/726,263, Office Action mailed May 31, 2012.
Varadarajan et al., "A Cascaded Cure Approach to Fabricate Highly Tensile Silicon Nitride Films," Novellus Systems, Inc., U.S Appl. No. 13/487,051, filed Jun. 1, 2012.
U.S Appl. No. 12/646,830, Final Office Action mailed May 25, 2012.
U.S Appl. No. 12/840,192, Office Action mailed Jul. 19, 2012.
U.S Appl. No. 11/656,661, Office Action mailed Jul. 19, 2012.
U.S Appl. No. 13/275,209, Final Office Action mailed Aug. 15, 2012.
U.S Appl. No. 11/369,311, Final Office Action mailed Jul. 31, 2012.
U.S Appl. No. 11/688,695, Office Action mailed Jun. 21, 2012.
U.S Appl. No. 11/731,581, Office Action mailed Aug. 28, 2012.
U.S Appl. No. 12/726,263, Office Action mailed Sep. 10, 2012.
U.S Appl. No. 12/840,192, Notice of Allowance mailed Sep. 20, 2012.
U.S Appl. No. 11/688,695, Notice of Allowance mailed Oct. 4, 2012.
U.S Appl. No. 12/210,060, Office Action mailed Oct. 3, 2012.
KR patent application No. 10-2010-0066153, Office Action mailed Mar. 26, 2012.
U.S Appl. No. 13/487,051, Office Action mailed Jan. 3, 2013.
U.S Appl. No. 10/972,084, Office Action mailed Oct. 5, 2012.
PCT International Search Report and Written Opinion dated Dec. 26, 2012, issued in WO patent application No. PCT/US2011/064246.

* cited by examiner

CARBON CONTAINING LOW-K DIELECTRIC CONSTANT RECOVERY USING UV TREATMENT

CROSS REFERENCE TO RELATED APPLICATION

This application is a continuation-in-part of prior application Ser. No. 12/940,324, filed Nov. 5, 2010 entitled UV TREATMENT FOR CARBON-CONTAINING LOW-K DIELECTRIC REPAIR IN SEMICONDUCTOR PROCESSING, now pending; which is a divisional application of application Ser. No. 11/590,661, filed Oct. 30, 2006 entitled UV TREATMENT FOR CARBON-CONTAINING LOW-K DIELECTRIC REPAIR IN SEMICONDUCTOR PROCESSING; the disclosures of which are incorporated by reference herein in their entirety.

BACKGROUND OF THE INVENTION

The invention relates to low dielectric constant layers in semiconductor processing for use in various applications. More specifically, the invention relates to the treatment for repair of process-induced damage of low dielectric constant dielectric materials in, for example, damascene processing.

The invention relates to semiconductor processing, in particular to repair of process-induced damage of low dielectric constant dielectric materials in, for example, damascene processing.

Low dielectric constant (low-k) insulating materials have been integrated into semiconductor devices in order to address reduced feature sizes and high performance requirements. These low-k dielectrics are mechanically weaker than previous generation dielectric materials. The inherently weak nature of the low-k dielectric material can pose significant challenges for downstream electronic-packaging processes and material compatibility.

Low-k materials are, by definition, those semiconductor-grade insulating materials that have a dielectric constant ("k") lower than that of $SiO_2$, i.e., 3.9. Various types of low-k materials can have dielectric constants ranging from about 3.8-3.6 (e.g., fluorosilicate glass (FSG)), to less than about 3.2 (e.g., (carbon doped oxide (CDO)), to as low as 2.2 (e.g., spin-on glass (SOG)) or even lower, and encompass low-k dielectrics referred to as "ultra low-k" (ULK) and "extreme ultra low-k" (ELK). In many CDO low-k implementations, such as are described herein as one aspect of the invention, suitable carbon-containing low-k materials have a dielectric constant of about 2.7 or lower. To further reduce the size of devices on integrated circuits, it has become necessary to use conductive materials having low resistivity and insulators having low dielectric constants to reduce the capacitive coupling between adjacent metal lines. Low-k materials are being integrated into the devices to improve device performance and allow for device scaling.

Low-k materials are less dense than standard insulating materials such as $SiO_2$. This low density introduces a host of process integration and material compatibility difficulties. Achieving a balance between maintaining a low-k film's integrity, integrating it properly, and performing the necessary stripping, cleaning, and conditioning is challenging. Patterning processes (etching, stripping, deposition, and cleaning) can also have a drastic impact on the integrity of carbon-containing low-k materials, in particular SiOC-based low-k materials.

The properties that give carbon-containing low-k dielectric materials their desirable low dielectric constants are the very same properties that are leading to significant integration challenges. Carbon-containing low-k materials achieve lower dielectric constants through the incorporation of non-polar covalent bonds (e.g., from the addition of carbon) and the introduction of porosity to decrease film density. Introducing porosity or the incorporation of terminal bonds, such as Si—$CH_3$, breaks the continuity of the rigid Si—O—Si lattice of traditional oxides, yielding a lower dielectric constant film that is both mechanically and chemically weaker. Because of the mechanical weakness, carbon-containing low-k films are susceptible to kinetic plasma damage that can undesirably densify the film and thus increase the film's effective k value.

Furthermore, chemical plasmas used in semiconductor processing operations to which dielectrics are exposed can modify carbon-containing low-k films where bonds such as Si—$CH_3$ are readily broken. The susceptibility of carbon-containing low-k materials to plasma modification poses a serious integration challenge since plasma processes are routinely used to etch, clean, and deposit films in the manufacturing of a semiconductor device. In a typical Damascene process flow, prior to metal barrier deposition, process induced carbon-containing low-k dielectric damage can be incurred by a patterned low-k dielectric from (plasma) etch, dry resist strip, wet cleaning and dry cleaning. Carbon-containing low-k materials are also susceptible to the intercalation of plasma species, residues, solvents, moisture, and precursor molecules that can either adsorb into, outgas from, or chemically modify the film. Thereafter, a conductive material, typically a metal, for example copper, is deposited onto the patterned dielectric layer to fill vias and trenches formed in the dielectric layer. Then, excess metal is removed via chemical mechanical polishing (CMP), thereby forming a planar surface comprising regions of exposed copper and low-k dielectric onto which other layers, such as a dielectric barrier, are deposited. The CMP process typically damages the low-k dielectric, resulting in carbon loss and water absorption. This causes the k of the low-k dielectric to increase, thereby lowering the RC improvement that the low-k material can potentially provide.

Also, exposed metal, particularly copper, regions are subject to oxidation prior to the formation of a dielectric barrier or subsequent layers on the wafer surface. And, organic residues of anti-corrosion components of CMP slurry, for example benzotriazole (BTA), may remain on a wafer surface after a CMP process. The presence of copper oxide and organic residue causes problems with the adhesion of the dielectric barrier on the wafer surface. Therefore, various cleaning processes may be used to remove such oxide and residue (another form of process-induced damage). In one specific example, such a wafer may be exposed to a direct plasma in a plasma-enhanced chemical vapor deposition (PECVD) processing chamber for a period of time prior to introducing chemical vapors to the processing chamber. The use of a reducing plasma, such as an ammonia or hydrogen plasma, may reduce copper oxide and hydrocarbons on the surface, thereby cleaning the surface. However, depending upon processing conditions, such direct plasmas also may affect a low-k dielectric surrounding the copper because the low-k material is locally densified at the surface either by ion bombardment or because of bound carbon removal through chemical activity. Some of the k damage induced by operations such as CMP to the low-k material may be recovered by doing a short anneal prior to the above described pre-treatment and etch stop deposition, but the recovery is only marginal.

SUMMARY OF THE INVENTION

The present invention provides a method for treatment of carbon-containing low-k dielectric with ultraviolet (UV)

radiation and/or a chemical silylating agent, for the repair of process-induced dielectric damage. The carbon-containing low-k dielectric may be, but is not limited to, carbon-doped oxide (CDO) having a dielectric constant of 2.7 or lower, including ultra low-k dielectrics having pre-processing dielectric constants as low as 2.6, 2.5, 2.4 or lower, and possibly including a metal feature. The methods of the invention are particularly applicable in the context of damascene processing to help recover lost low-k (offset increased dielectric constant) of a dielectric damaged during processing, either pre-metallization, post-planarization, or both. In various embodiments of the invention, the treatment is conducted in such a way that shrinkage of the dielectric is reduced or minimized and/or the extent of k-recovery is greatly enhanced relative to conventional annealing techniques.

In various embodiments, the incident UV radiation has a wavelength profile selected or configured to achieve k-recovery with relatively little dielectric shrinkage, in particular UV radiation that has a spectral profile characterized by greater than 50% of the UV radiation power having a wavelength of greater than 300 nm, for example UV radiation that has a spectral profile characterized by greater than 50% of the UV radiation power in a wavelength range of about 300 to 450 nm, or less than 10% of the UV radiation power in a wavelength range below 300 nm.

In other embodiments, the treatment combines UV radiation exposure with exposure to a chemical silylating agent. In various embodiments, the incident UV radiation may or may not be as characterized above.

The carbon containing low-k dielectric that is the subject of the treatment may be at any stage of semiconductor processing, and the treatment is generally applied following a processing operation in which it has been subjected to conditions that have caused its dielectric constant to be increased. Examples are following an etching operation to form trenches in the dielectric, such as pre-metallization in damascene processing. Or, after chemical mechanical polishing (CMP) of a dielectric surface, such as post-metallization and pre-barrier layer deposition in a damascene process. The invention may also be more generally applicable in any semiconductor processing context to decrease the dielectric constant of a susceptible carbon containing dielectric. For example, receiving in a processing chamber a semiconductor device substrate comprising a carbon containing dielectric, and exposing the semiconductor device substrate to UV radiation and, in some embodiments, a chemical silylating agent, as described herein, such that the dielectric constant of the carbon containing dielectric is increased.

This process is amenable to inclusion on a properly designed load lock or as a module for a PECVD semiconductor wafer processing system, such as a Vector Extreme configured PECVD system, available from Novellus Systems, Inc., San Jose, Calif., for example.

In one aspect, therefore, the invention relates to a method of forming a semiconductor device. The method involves receiving in a processing chamber a semiconductor device substrate comprising a carbon-containing low-k dielectric having a first dielectric constant. The carbon containing low-k dielectric is exposed to a UV treatment, the treatment including at least one of:

(a) exposure to UV radiation having a spectral profile characterized by greater than 50% of the UV radiation power having a wavelength of greater than 300 nm; and (b) exposure UV radiation and a chemical silylating agent. The dielectric constant of the carbon-containing low-k dielectric is decreased to a second dielectric constant.

In other aspects, the invention may be implemented in conjunction with lithographic patterning tools or processes, for example, for the fabrication or manufacture of semiconductor devices, displays, LEDs, photovoltaic panels and the like. The invention may also be implemented as an apparatus configured to accomplish the methods described herein. A suitable apparatus includes hardware for accomplishing the process operations and a system controller having instructions for controlling process operations in accordance with the present invention. Machine-readable media containing instructions for controlling process operations in accordance with the present invention may be coupled to the system controller.

DETAILED DESCRIPTION OF EMBODIMENTS

Figure 1:
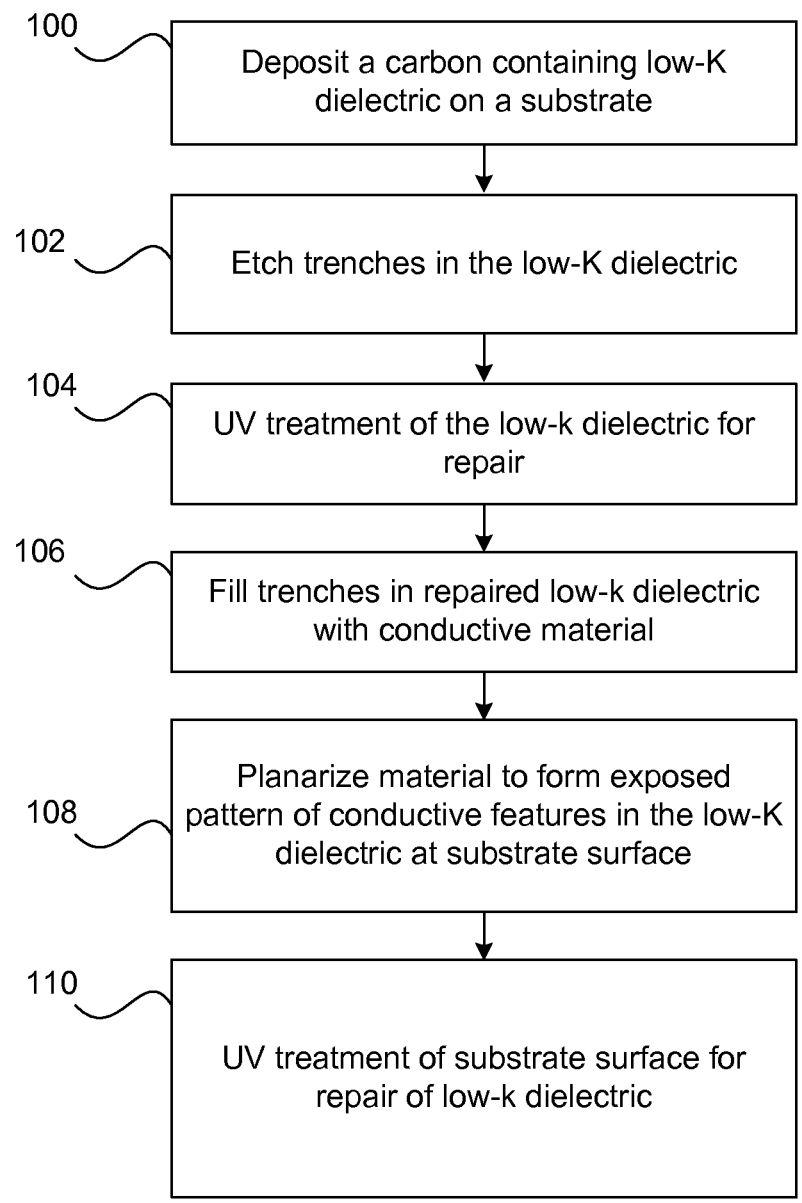
FIG. 1 is a process flow chart depicting a method of UV treatment and a process context in accordance with an embodiment of the invention.

Embodiments of the present invention are described herein primarily in the context of a treatment for carbon-containing low-k dielectric repair in damascene processing. However, the following detailed description of the present invention is illustrative only and is not intended to be in any way limiting. Other embodiments of the present invention will readily suggest themselves to those of ordinary skill in the art having the benefit of this disclosure. Reference will now be made in detail to implementations of the present invention as illustrated in the accompanying drawings.

Introduction

The term "semiconductor device" as used herein refers to any device formed on a semiconductor substrate or any device possessing a semiconductor material. In many cases, a semiconductor device participates in electronic logic or memory, or in energy conversion. The term "semiconductor device" subsumes partially fabricated devices (such as partially fabricated integrated circuits) as well as completed devices available for sale or installed in particular apparatus. In short, a semiconductor device may exist at any state of manufacture that employs a method of this invention or possesses a structure of this invention.

The present invention provides a method of semiconductor device fabrication that involves exposure of a carbon containing low-k dielectric to UV radiation having certain wavelength profiles and/or in combination with chemical silylating agents, or both, to reduce the dielectric constant of the subject carbon containing low-k dielectric. Treatments in accordance with the invention are effective for the repair of process-induced damage to the dielectric, for example, broken Si—$CH_3$ bonds in carbon-containing low-k dielectric (e.g., ULK CDO) resulting from plasma trench etching or CMP. Applicable carbon containing low-k dielectrics typically have SiO-based backbones doped with carbon, in particular CDO (for example, those formed from octamethyl cyclotetrasiloxane (OMCTS), tetramethylcyclotetrasiloxane (TMCTS), dimethyldimethoxysilane (DMDMOS), and diethoxymethylsilane (DEMS) and other known CDO precursors), but may also include hybrid polymers incorporating both C, Si and O in the backbone. The inventive methods are particularly, though not exclusively, applicable in the context of damascene processing. The invention also related to apparatus configured to implement the described methods.

In one aspect, therefore, the invention relates to a method of forming a semiconductor device. The method involves receiving in a processing chamber a semiconductor device substrate comprising a carbon-containing low-k dielectric layer having a first dielectric constant. The substrate is exposed to UV radiation in accordance with techniques described herein, such that the dielectric constant of the carbon-containing low-k dielectric layer is decreased to a second dielectric constant. While the invention is not limited to any particular theory of operation, it is believed that treatment repairs process induced low-k dielectric damage (e.g., dangling bonds or highly strained bonds, e.g., Si—O—Si or Si—$CH_2$—Si, caused by removal of organic (generally —$CH_3$) groups) caused by plasma etch, dry resist strip, wet cleaning and dry cleaning, for example, involved in a feature (e.g., trench) formation process, or other processing operation (e.g., post-metallization planarization. The repaired feature can then be coated with a material such as a barrier layer material, to protect against dielectric constant degradation. For example, where the feature is a trench for forming a line or via, a conductive material, particularly a metal diffusion barrier, followed by copper (or other suitable interconnect metal) may be applied in a metallization operation. In subsequent processing operations of some embodiments, another treatment in accordance with the present invention may be applied to the planarized top surface of a metallized semiconductor device to repair dielectric damage caused by planarization, generally by chemical mechanical polishing (CMP).

It should be understood that in such multi-step processes, a treatment in accordance with the present invention may be applied at one or more stages; for example, for pre-metallization repair of plasma etch-induced damage and/or post-planarization repair of planarization-induced dielectric damage. Also, UV treatments in accordance with the present invention may be combined with other UV or non-UV dielectric treatments.

Process Variations

As noted above, the present invention provides a method of semiconductor device fabrication that involves exposure of a carbon containing low-k dielectric to UV radiation having certain wavelength profiles and/or in combination with chemical silylating agents, or both, to reduce the dielectric constant of the subject carbon containing low-k dielectric. The subject carbon containing low-k dielectric is generally one that has been damaged by a prior processing or handling operation such that its dielectric constant has increased from its native value. A UV treatment in accordance with the present invention may have a variety of aspects with characteristics and/or constituents configured to decrease the dielectric constant of the treated carbon containing low-k dielectric.

According to a first aspect, in various embodiments the substrate is exposed to UV radiation having a spectral profile characterized by greater than 50% of the UV radiation power having a wavelength of greater than 300 nm; or where greater than 50% of the UV radiation power is in a wavelength range of about 300 to 450 nm; or where greater than 50% of the UV radiation power is in a wavelength range of about 300 to 400 nm. A suitable spectral profile according to this aspect of the present invention may also be characterized as having less than 10% of the UV radiation power in a wavelength range below 300 nm; or having less than 5% of the UV radiation power in a wavelength range below 300 nm; or having less than 1% of the UV radiation power in a wavelength range below 300 nm. A suitable spectral profile according to this aspect of the present invention may also be characterized as having a proportion of UV radiation power in a wavelength range of 200 to 240 nm to UV radiation power in a wavelength range of 300 to 400 nm in the UV radiation to which the carbon containing low-k dielectric is exposed being no more than 10%.

A suitable source of UV radiation in accordance with some embodiments of this aspect of the present invention is a Fe-filled ("D") bulb. In some embodiments, a high pass filter is used with the D bulb to filter out the UV radiation having a wavelength below 300 nm prior to exposure of the carbon containing low-k dielectric. The filter may be a 295 nm high pass filter.

Another suitable source of UV radiation in accordance with some embodiments of this aspect of the present invention is a Ga-filled ("V") bulb. In some embodiments, a high pass filter is used with the V bulb to filter out the UV radiation having a wavelength below 300 nm prior to exposure of the carbon containing low-k dielectric. The filter may be a 295 nm high pass filter.

As described further below, changes in material properties correlated with performance advantages have been observed as a result of UV treatments in accordance with the present invention. An important benefit the treatment with radiation having the spectral profile described above is that k-recovery is obtained while dielectric shrinkage associated with other dielectric repair treatments is reduced or minimized. Shrinkage generates stress, particularly post-metallization, potentially leading to stress migration failures. Also, variability in pattern density and consequent variability in shrinkage can cause the dielectric to lose its planarity. While the invention is not limited to any particular theory of operation, this is believed to be achieved by reducing the sub-300 nm component of the UV radiation spectral profile where ULK CDO films have significant absorption.

Treatments of a post-CMP carbon containing low-k dielectric have resulted in a dielectric constant that is at least 0.1 less than the pre-treatment dielectric constant and the dielectric shrinks by less than 2% as a result of the UV radiation exposure; or at least 0.1 less than the pre-treatment dielectric constant and the dielectric shrinks by less than 1% as a result of the UV radiation exposure; or at least 0.06 less than the pre-treatment dielectric constant and the dielectric shrinks by less than 0.5% as a result of the UV radiation exposure.

According to a second aspect of the invention, the UV treatment may comprise a UV radiation exposure in combination with chemical silylating agent exposure. Silylation involves the replacement of an acidic hydrogen on a compound with an alkylsilyl group. According to this aspect, the UV radiation may be as described above in relation to the first aspect of the invention so that UV radiation incident on the carbon containing low-k dielectric has a spectral profile constrained to achieve reduced shrinkage with k-recovery. Alternatively, the incident UV radiation in conjunction with this aspect of the invention may not be so constrained, and may be, for example, sourced from a convention H or H+ (mercury) bulb, a D bulb, a V bulb or any other suitable source. The UV source can be a single wavelength excimer lamp or broad spectrum source with arc or microwave excitations.

In general, the selection of UV wavelength(s), total exposure time and intensity, etc., depends on a number of factors, including the thickness of the dielectric film and the composition of the dielectric film. Suitable UV treatment parameters for the constrained spectrum UV radiation exposure of the first aspect of the invention described above may be in the power intensity range of about 1 mw-20 W/cm$^2$, for example about 500 mW-5 W/cm$^2$; at a wavelength of about 300-450 nm, for example about 300-400 nm. Suitable UV treatment parameters for an unconstrained spectrum UV radiation exposure suitable for use in conjunction with a chemical silylating agent exposure in accordance with the second aspect of the invention described above may be in the power intensity range of about 1 mw-20 W/cm$^2$, for example about 500 mW-5 W/cm$^2$; at a wavelength of about 150-500 nm, for example about 200-400 nm. Exposures for up to about 1 minute, for example about 15, 30 or 45 seconds; at a wafer temperature of between room temperature up to about 450° C., preferably about 200-400° C., for example 400° C., are suitable in either instance. A typical UV exposure in accordance with this aspect of the invention has a power density of about 1-3 W/cm$^2$ at a wafer temperature of about 400° C. for about 45 seconds. The process pressure can range from about 1 mTorr to 760 Torr, preferably from about 5 Torr to 700 Torr.

The apparatus employed to implement the invention can have one or more UV sources. In some embodiments described herein, the apparatus will have a single UV source. In one particular implementation on a SOLA UV thermal processing system, available from Novellus Systems, Inc., UV intensity can be anywhere between 10-100%. Lower intensity generally requires longer exposure times. Temperature is set below target thermal budget (e.g., 350-400° C.). Pressure can be as noted above. The UV wavelength sources can be as described above. Suitable apparatus are described in more detail below with reference to FIG. 3.

Further in accordance with the second aspect of the invention, the chemical silylating agent is generally an alkyl silane, substituted or un-substituted. Suitable classes and examples of alkyl silane silylating agents in accordance with this aspect of the invention include:

Methyl Silanes

These could contain either 3, 2 or 1 hydrolyzeable (functional) groups including chloro, methoxy, ethoxy, propoxy, methoxyalkoxy, dimethylamine, diethyl amine other amines, silazanes (NH), or combinations thereof. Suitable bi-functional examples are dimethyldichlorosilane, dimethyldimethoxysilane, dimethyldiethoxysilane, dimethylamino trimethyl silane, bis(dimethylamino)dimethylsilane and bis(diethylamino)dimethylsilane.

Linear Alkyl Silanes

As above, but with one or more of the methyl group replaced by other linear alkyl groups (e.g., ethyl, propyl, butyl, etc). A suitable example is ethylmethyldichlorosilane.

Branched and Cyclic Alkyl Silanes

As the methyl silanes, but with one or more of the methyl groups replaced by branched or cyclic alkyls (e.g., isopropyl, isobutyl, etc).

Dialkyl Silanes

As the methyl silanes, but with all methyl groups replaced by pairs of larger alkyl groups (e.g., diethyldichlorosilane, diethyldiethoxysilane).

Suitable silylating agent partial pressures are between about 1 and 700 Torr, for example 10-300 Torr. A typical silylating agent flow rate is about 3 to 15 ml/min. Exposure times of about 1 to 10 minutes, for example about 5 minutes, are generally suitable. At very lower partial pressures, longer exposure times will generally be required.

In still other embodiments, a non-silicon containing chemical reagent that can donate methyl groups or other carbons, or could be UV active such that they can be activated by UV to enable a dielectric repair reaction to proceed may be used in place of the chemical silylating agent. Suitable examples include acetone, dimethyl carbonate.

The invention may be implemented in a single process module having one or more stations, or across multiple modules each having one or more stations. Often, but not always, the invention is implemented in one or more multi-station modules where the substrate (work piece) can be moved from station to station without necessarily breaking vacuum. The process parameters for the UV treatment, including intensity, wavelength, temperature, pressure, time and reagent flow, including chemical silylating agent, may be independently controlled and varied, and any or all of the process conditions may be varied from station to station. In particular, there may be independent control of temperature, silylating agent and UV irradiation. For example, the wafer may be brought to a temperature T for a time t, exposed to a silylating agent for a time t1, exposed to UV radiation and a silylating agent for time t2, exposed to UV radiation only for a time t3, and then moved to another station in a multi-station processing apparatus where any of the conditions including temperature, UV radiation intensity, pressure, wavelength, flow, and time may be independently changed within the described parameters.

A carbon containing low-k dielectric may be subjected to a UV treatment in accordance with the present invention in a variety of different ways according to various embodiments of the invention. The UV treatment may be with UV radiation exposure of a constrained spectral profile, as described herein, alone; and/or with UV radiation of a constrained spectral profile may be combined in various ways with a chemical silylating agent exposure; and/or with UV radiation of an unconstrained spectral profile, as described herein, in the presence of the silylating agent.

In some specific embodiments, the UV treatment may include the following operations: UV radiation exposure (constrained or unconstrained) in an inert (e.g., He, Ar, etc.) atmosphere; followed by exposure to a chemical silylating agent; followed by UV radiation exposure (constrained or unconstrained) in an inert (e.g., He, Ar, etc.) atmosphere again. The treatment may or may not have an air break between operations, or may have just one air break, either prior to or after the silylating agent exposure. The operations of the treatment could be performed at the same or different temperatures. For example, UV radiation exposure at about 400° C.; and silylating agent exposure at the same or a lower temperature in the range of about 50 to 400° C., for example about 90° C. in a treatment where UV radiation operations precede and follow the silylating agent exposure.

Alternatively, the initial UV radiation exposure operation may be replaced with a thermal anneal operation (e.g., 400° C. for about 1 to 30 minutes, for example 5 minutes in an inert atmosphere), or not performed at all. Again, the treatment may or may not have an air break between operations. And again, the operations of the treatment could be performed at the same or different temperatures. For example, anneal and/or UV radiation exposure at about 400° C.; and silylating agent exposure at the same or a lower temperature in the range of about 50 to 400° C., for example about 150° C. in a treatment where an anneal operation precedes the silylating agent exposure, which is followed by a UV radiation exposure operation.

In other embodiments, the subject carbon containing low-k dielectric may be exposed to the UV radiation during exposure to the chemical silylating agent. For example, the treatment may be a single operation including exposure to UV radiation in the presence of the silylating agent. Or, exposure to UV radiation in the presence of the silylating agent can be followed by a further exposure to UV radiation without the silylating agent, for example in an inert gas (e.g., He); or the reverse operations (i.e., exposure to UV radiation without the silylating agent, for example in an inert gas (e.g., He) followed by a further exposure to UV radiation in the presence of the silylating agent.

Treatments of pre-metallization plasma damaged carbon containing low-k dielectrics with UV treatments including a chemical silylation agent exposure in accordance with the present invention can achieve k reductions of as much as 0.5 or more and to a k value of as low as 2.4 or lower.

Following the treatment, a barrier layer may be deposited on the low-k dielectric, prior to subsequent processing of the semiconductor device.

Semiconductor Processing Contexts

FIG. 1A is a process flow chart depicting operations that may be performed in various methods in accordance with embodiments of the present invention. The invention is advantageously applied in a damascene processing context, although its application is not so limited. It should be understood that, in some aspects, the present invention requires only a UV treatment as described herein of an applicable semiconductor device substrate having a carbon containing low-k dielectric (e.g., ULK CDO), such as described in operations 104 and/or 110 of the embodiment illustrated in FIG. 1A. Other aspects of the invention may include additional processing operations, such as damascene processing operations described herein. But the invention is not limited to the performance of these additional processing operations in all its aspects. A generalized version of a dual damascene technique is described below with reference to FIGS. 2A through 2D, which depict a partially formed semiconductor device during various stages of this process. The invention may also be used in conjunction with other semiconductor processing techniques.

Referring now to FIG. 1A, in operations that are not necessarily part of the present invention, but place an embodiment of the invention in context in an advantageous application, a carbon containing low-k dielectric is deposited on a substrate at 100. Patterns of conductive features are formed in the dielectric layer, generally by plasma etching of trenches, at 102. Plasma etching generally results in damage to the pattern edges, generally trench sidewalls and bottoms. Other process operations, such as dry resist strip, wet cleaning and dry cleaning, can also cause or contribute to low-k dielectric damage. The conductive features are typically, though not necessarily, metal lines and vias. In one example, they are the interconnects of a metallization layer that is subsequently formed from copper. As is known to those of skill in the art, various techniques may be employed to form such features.

The formed features (e.g., etched trenches) are then exposed to an ultraviolet (UV) treatment in accordance with the present invention at 104. Process variations for specific embodiments of a UV treatment in accordance with the present invention are described above and may include a constrained UV spectral profile and/or a chemical silylating agent. While the invention is not limited to any particular theory of operation, it is believed that the UV exposure of the damaged dielectric surface cross-links SiOH groups, to bring about silanol reduction, resulting in the formation of Si—O—Si bonds.

Following this UV treatment, a barrier layer may be deposited on the low-k dielectric layer prior to subsequent processing of the semiconductor device. For example, in operations that are not necessarily part of the present invention but are provided for context for one embodiment as noted above, the trenches may then be filled at 106 with a conductive material, typically and conductive barrier layer and then copper (Cu), although other metals may also be used. When filling the features, excess material will have to be removed from the top (exposed surface) of the dielectric. The excess material may be removed by a planarization process to form an exposed pattern of conductive features in the dielectric at 108. As discussed above, one widely-used planarization process is chemical mechanical polishing (CMP), however slurry from CMP can chemically remove carbon groups from a carbon containing low-k dielectric.

According to a further aspect of the invention, to repair the CMP-induced dielectric damage, the planarized surface can be exposed to a further UV treatment in accordance with the present invention, at 110. The UV treatment may be conducted under the same conditions as described above with reference to the post-trench etch treatment, or other conditions as described herein.

Following the damascene processing repair in accordance with this embodiment of the present invention, a diffusion barrier film, such as a copper diffusion barrier film, may be deposited on the planarized surface of the partially-formed semiconductor device. This layer may serve other purposes aside from that of a diffusion barrier. For example, the diffusion barrier film may also act as an etch stop layer.

According to various implementations of the present invention, a UV treatment as described herein may be conducted at any stage of a semiconductor processing operation where a carbon containing low-k dielectric has been damaged by a prior processing operation, and/or could otherwise benefit from a treatment to recover or enhance its low-k property. For example, in a semiconductor processing operation that involves damascene processing, a treatment may be applied at either or both the pre-metallization (e.g., trench fill) and post-planarization stages of the damascene processing. Where a plurality of UV radiation treatments in accordance with the present invention are applied, the treatments may be the same or different, within the parameters described herein. Alternatively, a UV radiation treatment in accordance with the present invention may be combined with other processing techniques at one stage or the other of a multi-step process. For example, a UV exposure with a reducing agent exposure, as described in co-pending application Ser. No. 12/646,830, filed Dec. 23, 2009, incorporated by reference herein, may be used at one stage or the other, particularly post-planarization in a damascene processing, while a UV radiation exposure in accordance with the present invention is used in another stage, for example for trench repair pre-metallization.

Referring now to FIGS. 2A-2D, a typical dual damascene process incorporating processing-induced damage repair processes of the present invention is illustrated. As noted above, it should be understood that an embodiment of the invention in context in an advantageous application is depicted. In at least some aspects, the present invention requires only a UV treatment of the semiconductor device substrate, as described above. Other aspects of the invention may include additional processing operations, such as damascene processing operations described herein, including lithographic operations. But the invention is not limited to the performance of these additional processing operations in all its aspects.

Figure 2A:
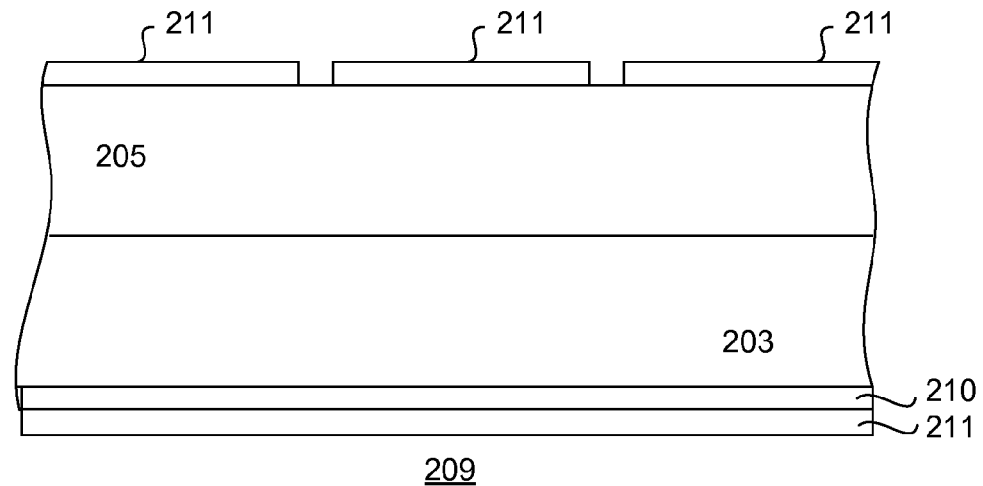
FIGS. 2A-2D are cross-sectional diagrams illustrating the formation of a semiconductor device by a dual damascene process in accordance with an embodiment of the invention.

Referring to FIG. 2A, first 203 and second 205 layers of dielectric are deposited in succession, possibly separated by deposition of an etch stop layer, such as a silicon nitride layer. As is well known in the art, according to alternative damascene processing techniques a single thicker dielectric layer can be used instead of discrete first and second layers.

Figure 2B:
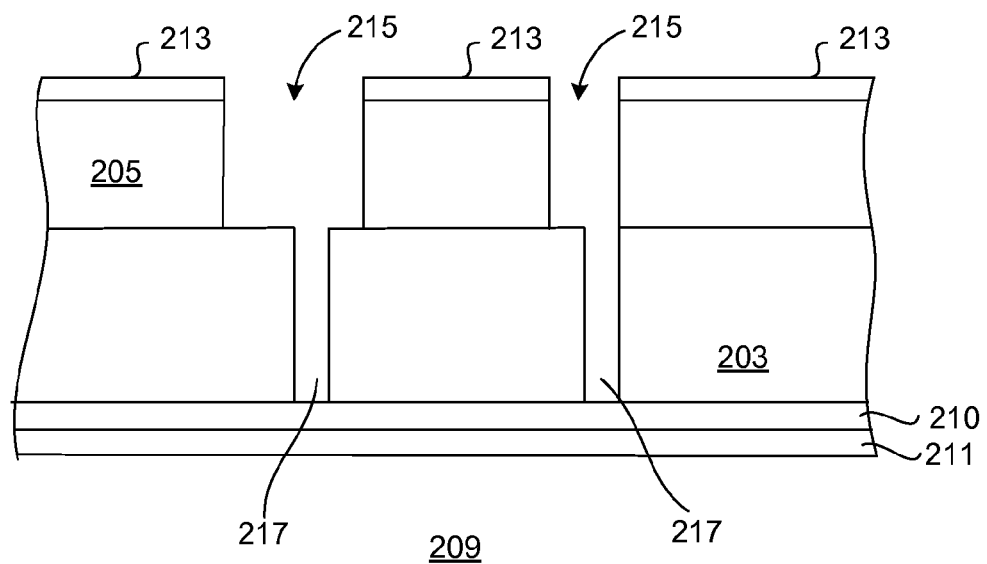
Figure 2C:
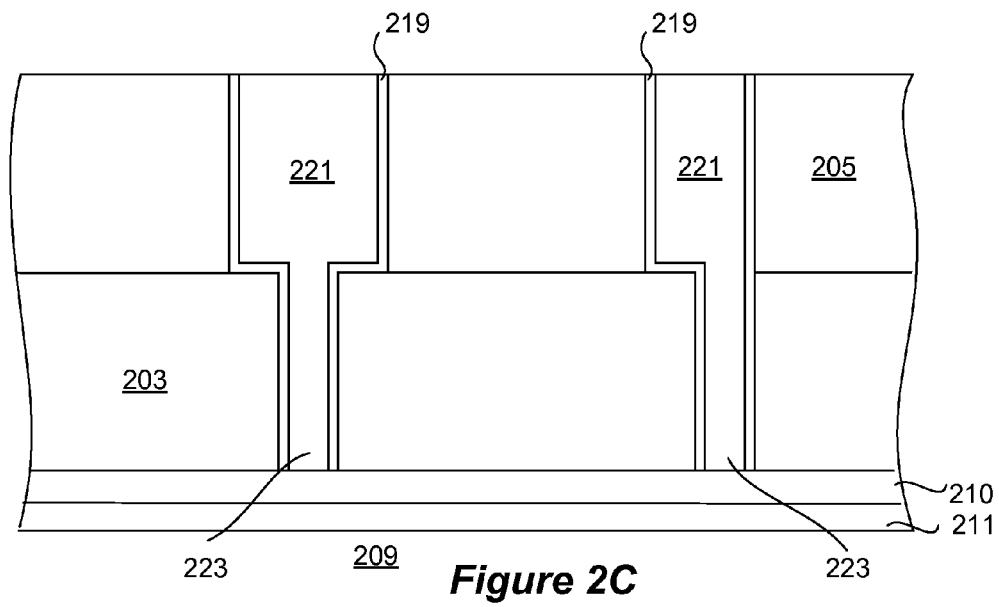
Figure 2D:
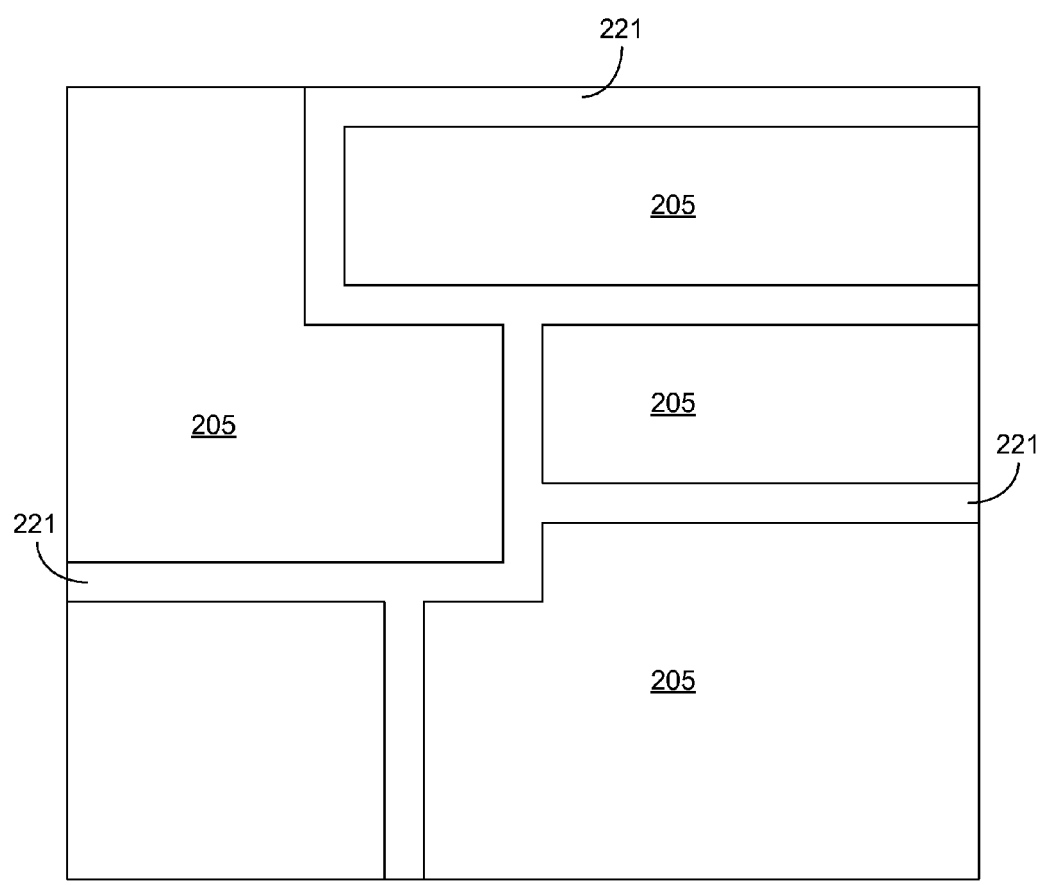

After deposition of the second dielectric layer 205, a via mask 211 is formed having openings where vias will be subsequently etched. Next, the vias are partially etched down through the level of the second dielectric 205. Then via mask 211 is stripped off and replaced with a line mask 213 as depicted in FIG. 2B. A second etch operation is performed to remove sufficient amounts of dielectric to define line paths 215 in second dielectric layer 205. The etch operation also extends via holes 217 through first dielectric layer 203, down to contact an etch stop layer 210 above a metal layer 211 on the underlying substrate 209.

It should be noted that the foregoing description is just an example of one via-first dual damascene process with which the present invention may be implemented. In other embodiments, a via-first process may involve complete etching of the vias prior to etching of the line trenches. Or, a trench-first process, in which the etching of the line trenches precedes the via etching, may be used. These various damascene processing techniques, and other variations thereon, are well known in the art and represent alternative implementation contexts for embodiments of the present invention. The invention is also applicable is single damascene processing, more conventional metal deposition and etch, and essentially any semiconductor processing context where carbon-containing low-k dielectrics are used.

Further in this regard, the term "trench" in the context of damascene processing is commonly understood to describe a feature formed in dielectric and subsequently filled to form a conductive line in a dielectric layer. In a more general semiconductor processing context, the term is also understood to describe a feature formed in dielectric and subsequently filled to form an element of a semiconductor device (e.g., via, line, STI, etc.), and may include a damascene trench or a combined damascene structure. Unless it is otherwise clear from the context, when used herein, the term should be understood to have its broader meaning After trench etching, the photoresist is removed in another plasma process, followed by a wet or dry clean and then damage on the low-k dielectric surface is repaired by a UV treatment, as discussed above.

Thereafter a thin layer of conductive barrier layer material 219 is formed on the exposed surfaces (including sidewalls) of dielectric layers 203 and 205. Conductive barrier layer material 219 may be formed, for example, of tantalum or tantalum nitride. A CVD or PVD operation is typically employed to deposit conductive barrier layer material 219. Prior to the deposition of the barrier material, a plasma process is typically used to clean the bottoms of the trenches to remove oxidation and contaminants from the exposed copper surface on the underlying layer. As is known to those skilled in the art, this barrier "preclean" plasma process can be simply an inert plasma or a reactive plasma of a gas such as hydrogen. The preclean plasma process can also damage a low-k dielectric film. A UV treatment as described above to repair the damaged low-k film may employed prior to the PVD operation for Ta or TaN.

On top of the barrier layer, a conductive metal (typically copper) is deposited in the trench and line paths 217 and 215. Conventionally this deposition is performed in two steps: an initial deposition of a conductive seed layer followed by bulk deposition of copper by electroplating. The seed layer may be deposited by physical vapor deposition, chemical vapor deposition, electroless plating, etc. Note that the bulk deposition of copper not only fills line paths 215 but, to ensure complete filling, also covers all the exposed regions on top of second dielectric layer 205.

Thus, it becomes necessary to planarize the structure and remove the excess copper from the device. Planarization removes material down to the level of the top of dielectric layer 205. This results in an exposed pattern of conductive lines 221 in dielectric layer 205 and vias in dielectric layer 203. (See the cross-sectional view of FIG. 2C and the simplified top view of FIG. 2D.)

Planarization may be accomplished by various techniques. Typically, the process involves some amount of CMP. It may also involve a combination of electropolishing, to remove most of the excess bulk copper, followed by CMP to remove the remaining copper down to the level of the top surface of dielectric layer 205. As discussed above, slurry from CMP can chemically remove carbon groups, and the in-situ plasma based processes typically used to remove the oxides from the conductive lines after the planarization process can also remove carbon groups leaving silicon dangling bonds on the surface of low-k dielectric films. Each of these types of damage also results in significant water absorption, resulting in an increase in dielectric k.

As described previously, another aspect of the invention relates to post-planarization (e.g., CMP) damage repair arising in damascene processing. According to this aspect, following planarization by CMP, Si—OH (silanol) bonds (formed by removal of organic (generally —$CH_3$) groups by CMP slurry and processing and reaction of water in the slurry with resulting dangling Si— bonds), or other carbon-containing low-k dielectric film damage (e.g., highly strained bonds), are repaired by exposing the surface to a UV treatment, as described above.

Apparatus

The present invention can be implemented in many different types of apparatus. In some embodiments, the apparatus will include one or more chambers (sometimes referred to as process modules) that house one or more wafers and are suitable for wafer processing. At least one chamber will include a UV source. A single chamber may have one or more stations and may be employed for one, some or all operations of the invention. Each chamber may house one or more wafers (substrates) for processing. The one or more chambers maintain the wafer in a defined position or positions (with or without motion within that position, e.g., rotation, vibration, or other agitation) during procedures of the invention. For certain operations in which the wafer temperature is to be controlled, the apparatus may include a controlled temperature wafer support, which may be heated, cooled, or both. The wafer support may also be controllable to provide the defined wafer positions within a process module. The wafer support may rotate, vibrate, or otherwise agitate the wafer relative to the UV source.

Figure 3:
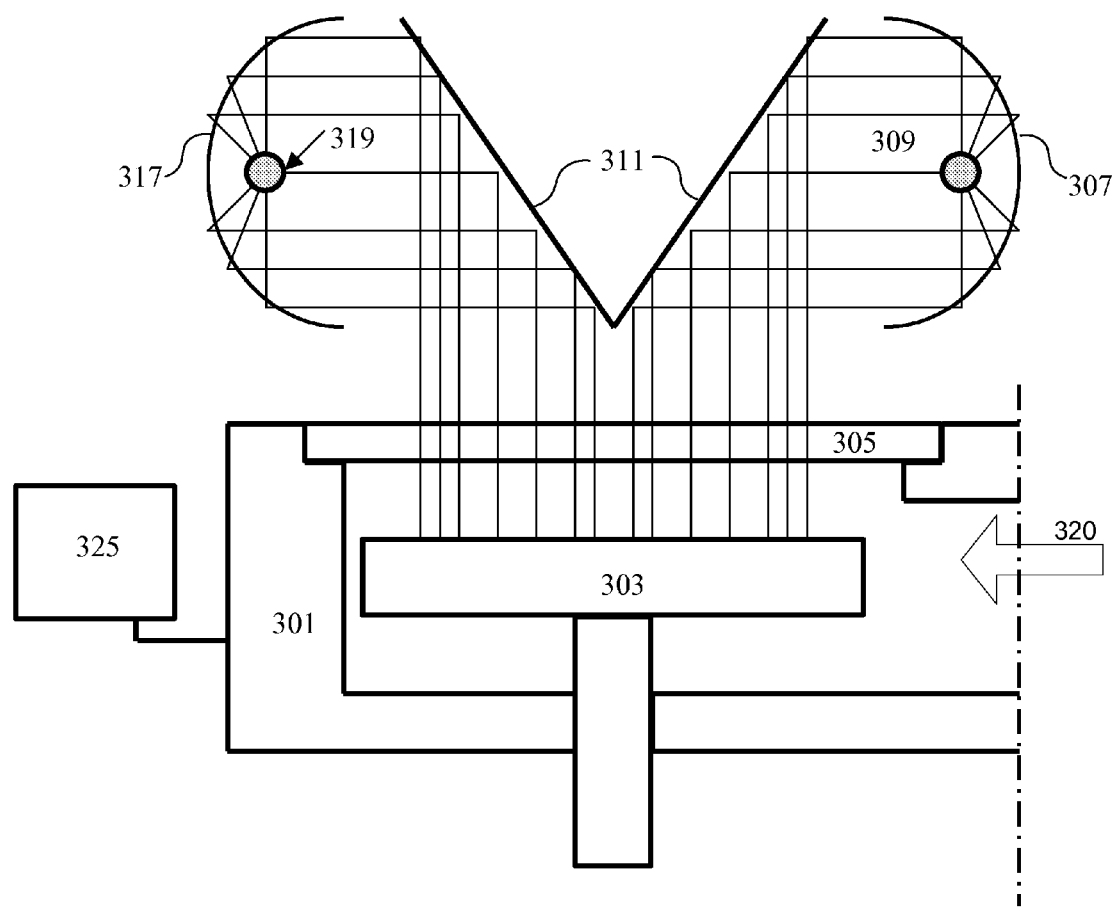
FIG. 3 is a schematic diagram of an example process chamber suitable for implementing the present invention.

FIG. 3 depicts the arrangement of a UV light source suitable for implementation of the present invention. In this embodiment, a cold mirror reflector seeks to diminish the incidence of IR radiation on the wafer, while permitting UV radiation to be available for processing. For clarity, this figure depicts only one of the possible multiple processing stations available in an apparatus of this invention. Also, this figure omits depiction of the wafer for purposes of clarity, and shows a flood-type reflector. It will be apparent to those skilled in this art that the principles depicted in FIG. 3 may also be applied to a focused reflector.

Referring to FIG. 3, pedestal 303 is embedded into one station of a processing chamber 301. Window 305 is located appropriately above pedestal 303 to permit radiation of the wafer (not shown here) with UV output of the desired wavelengths from UV lamps 309 and 319. Suitable lamps for the UV light source may include, but are not limited to, mercury vapor, D or V bulb lamps, with or without filters, as described above. In this embodiment, both lamps 309 and 319 are equipped with reflectors 307 and 317 which render their output into flood illumination. Reflectors 307 and 317 may themselves be made from "cold mirror" materials, i.e., they may also be designed to transmit IR and reflect UV radiation.

Radiation emanating directly from lamps 309 and 319 as well as that reflected from reflectors 307 and 317 is further incident upon a set of reflectors 311. These reflectors are also cold mirrors designed to reflect only those UV wavelengths that are desired for the purposes of curing the film on the wafer. All other radiation including visible and most particularly the IR is transmitted by this set of cold mirrors. Therefore the UV wavelengths are preferentially transmitted to the film. It will be apparent to those skilled in this art that the specific angle, distance, and orientation of the cold mirror reflectors 311 with respect to the lamps 309 and 319 may be optimized to maximize the UV intensity incident on the wafer and to optimize the uniformity of its illumination.

The chamber 301 is capable of holding a vacuum and/or containing gases at pressures above atmospheric pressure. For simplicity, only one station of one chamber 301 is shown. It is noted that in some embodiments, chamber 301 is one chamber in a multi-chambered apparatus, although chamber 301 could alternatively be part of a stand-alone single chambered apparatus. In either case, the chamber(s) may have one or more than one station. In some embodiments of the present invention, the UV process modules have one station. Suitable apparatus for implementation of the invention may include configurations as described herein of INOVA, Sequel, Vector and SOLA systems from Novellus Systems, Inc. of San Jose, Calif., and Endura, Centura, Producer and Nanocure systems from Applied Materials of Santa Clara, Calif. In a particular example, the invention may be implemented on a Vector Extreme tool from Novellus Systems, Inc. of San Jose, Calif.

Note that the UV light source configuration of FIG. 3 is only an example of a suitable configuration. In general, it is preferable that the lamps are arranged to provide uniform UV radiation to the wafer. For example, other suitable lamp arrangements can include arrays of circular lamps concentrically or otherwise arranged, or lamps of smaller length arranged at 90 degree and 180 degree angles with respect to each other may be used. The light source(s) can be fixed or movable so as to provide light in appropriate locations on the wafer. Alternatively, an optical system, including for example a series of movable lenses, filters, and/or mirrors, can be controlled to direct light from different sources to the substrate at different times.

The UV light intensity can be directly controlled by the type of light source and by the power applied to the light source or array of light sources. Factors influencing the intensity of applied power include, for example, the number or light sources (e.g., in an array of light sources) and the light source types (e.g., lamp type or laser type). Other methods of controlling the UV light intensity on the wafer sample include using filters that can block portions of light from reaching the wafer sample. As with the direction of light, the intensity of light at the wafer can be modulated using various optical components such as mirrors, lenses, diffusers and filters. The spectral distribution of individual sources can be controlled by the choice of sources (e.g., mercury vapor lamp (H or H+ bulb), xenon lamp, deuterium lamp, iron filled ("D") bulb, gallium filled ("V") bulb, excimer laser etc.) as well as the use of filters that tailor the spectral distribution.

The apparatus also includes a source of a chemical silylating agent 320, such as an alkyl silane as described above.

In certain embodiments, a system controller 325 is employed to control process conditions during the UV treatment processes in accordance with the present invention. The controller will typically include one or more memory devices and one or more processors. The processor may include a CPU or computer, analog and/or digital input/output connections, stepper motor controller boards, etc.

In certain embodiments, the controller controls all of the activities of the apparatus. The system controller executes system control software including sets of instructions for controlling the timing, supply of reagents (e.g., silylating agent), chamber pressure, chamber temperature, wafer temperature, UV wavelength, intensity and exposure time, and other parameters of a particular process. Other computer programs stored on memory devices associated with the controller may be employed in some embodiments.

Typically there will be a user interface associated with controller 325. The user interface may include a display screen, graphical software displays of the apparatus and/or process conditions, and user input devices such as pointing devices, keyboards, touch screens, microphones, etc.

The computer program code for controlling the processes can be written in any conventional computer readable programming language: for example, assembly language, C, C++, Pascal, Fortran or others. Compiled object code or script is executed by the processor to perform the tasks identified in the program.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive processes. Examples of programs or sections of programs for this purpose include substrate positioning code, silylating agent control code, pressure control code, heater control code, and UV radiation control code. In one embodiment, the controller includes instructions for performing processes of the invention according to methods described above.

It should be understood that the apparatus depicted in FIG. 3 is only an example of a suitable UV process module and that other designs may be used. The semiconductor device should be transferred from the UV module to the barrier layer deposition module without an air break. This may be accomplished on multiple of single tools.

EXAMPLES

The following provides examples of specific implementations of the present invention and performance data in order to give a better understanding of the operation and benefits of the invention. The invention is, however, in no way limited to these specific implementations.

Post-CMP k Recovery Using UV Treatment

As part of the solution to lower RC delay, materials with significantly lower k (k<2.60) are being used as ILD materials. The typical way to reduce the k is through incorporation of porogen in these materials, which is eventually driven out and the film is cross-linked to increase its hardness (typically using UV).

After electroplating of copper, it is planarized using CMP. These porous ULK materials are susceptible to CMP damage. Some amount of C removal occurs from the surface of these films, with consequent moisture intake resulting in an increase in its dielectric constant.

The next step in the process is deposition of a dielectric barrier/etch stop layer (typically SiC or SiN using PECVD). Typically, a long soak step (10-30 s) in an inert atmosphere at 400° C. is used to remove the moisture from the film prior to the DB/ESL deposition. At this point, the film is capped off, so no further moisture in-take is possible.

In experiments performed (on a pULK k2.3x film) to evaluate processes in accordance with the present invention, the k loss brought about by CMP process induced damage was about 0.2. Using just a thermal anneal at 400° C. the k recovery was about 0.05-0.06. Time was immaterial; no difference being observed between 1 and 30 min.

When exposed to a broadband UV source, such as that from a H+ bulb having emissions all the way down to 200 nm, in an inert atmosphere, the k recovery was about 0.11-0.12, about twice that of a standard anneal. Exposure times of 45 s and 60 s were evaluated as part of these tests. No difference was observed for longer times.

Figure 4:
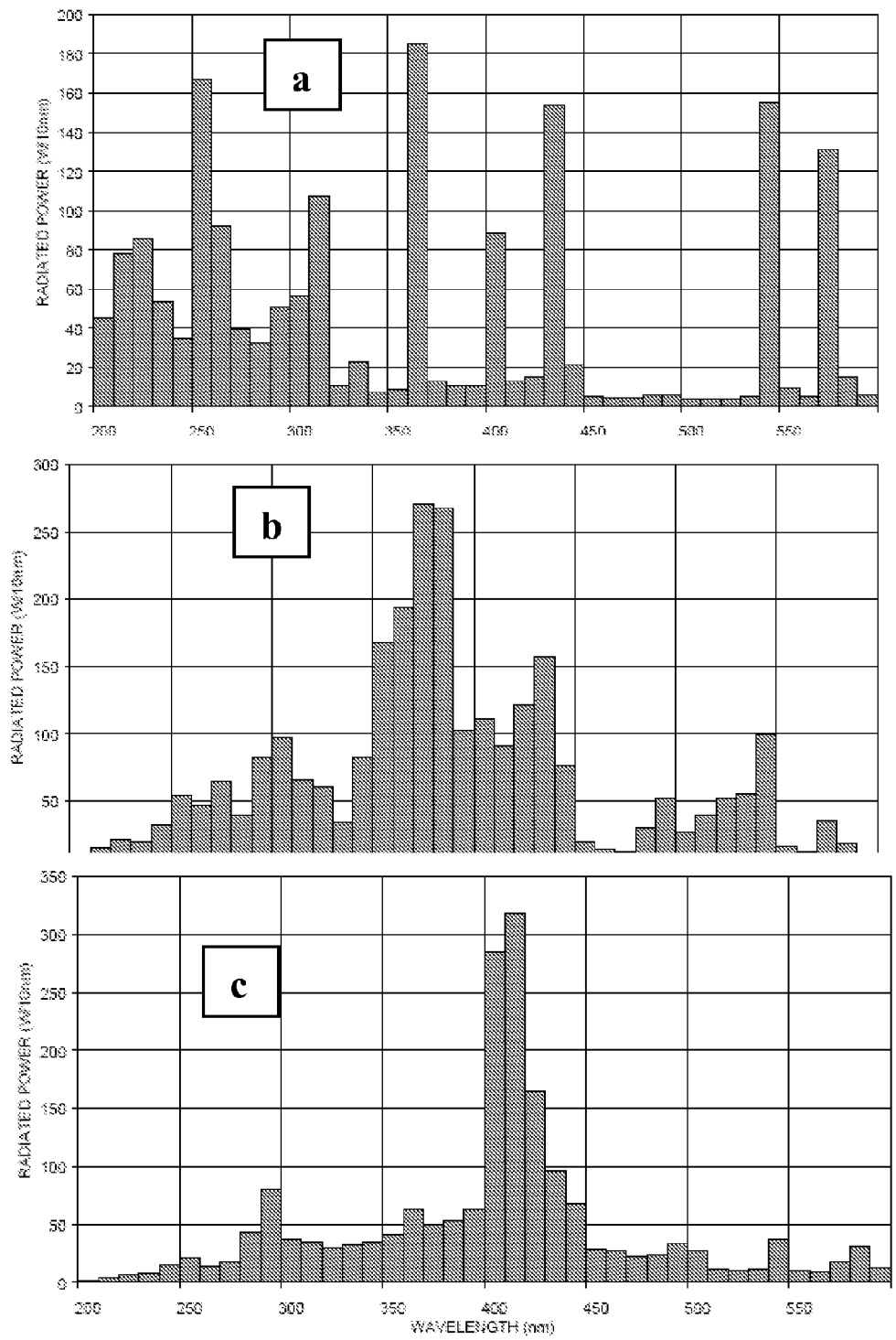
FIG. 4 depicts emission spectra showing the radiated power profiles for H+, D and V bulbs in FIGS. 4 (a), (b) and (c), respectively.

The same degree of k recovery as H+ bulbs is seen even with D or V bulbs. These bulbs have different dopants in them such that their emission spectra is altered. Emission spectra showing the radiated power profile for H+, D and V bulbs are shown in FIGS. 4 (a), (b) and (c), respectively, for reference. The main impact of these dopants is that there is very little to no emission in the shorter wavelengths (200-240 nm). This is the region where a ULK CDO film has significant absorption. Therefore, not having these wavelengths prevents the ULK films from further curing/shrinkage, while moisture removal still occurs. The 300-40 nm region dominates the D bulb emission spectral profile, while V bulbs have their peak emission above 380 nm.

Figure 5:
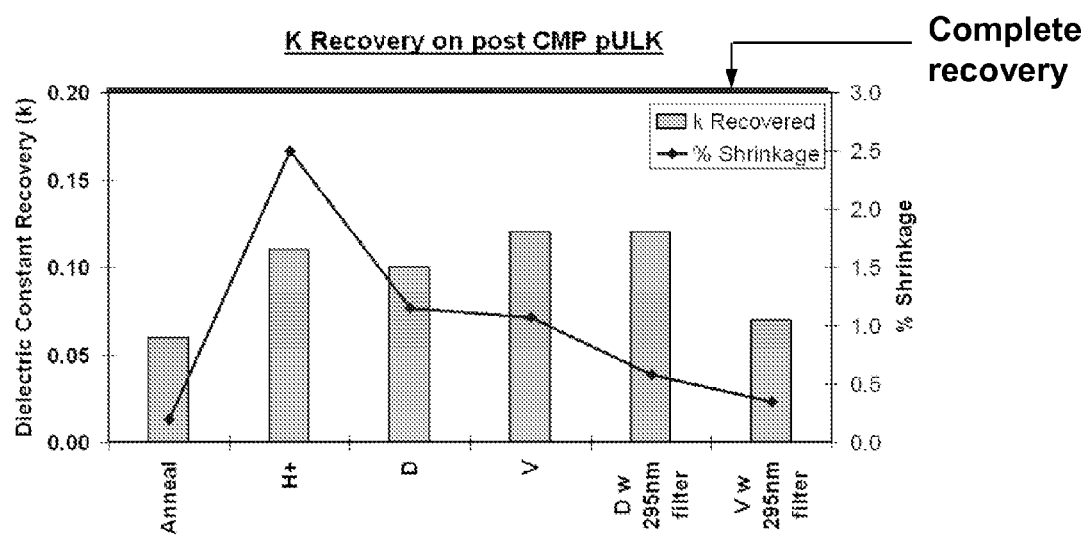
FIGS. 5 and 6 depict data plots illustrating the benefits of UV treatments in accordance with the present invention.

The main drawback of using H+ bulbs for a UV treatment for k recovery is the resulting shrinkage of the treated carbon containing low-k dielectric. As can be seen from FIG. 5, UV exposure using an H+ bulb UV source causes the film to further shrink by 2.5%. In comparison, a thermal anneal results in only about 0.2% shrinkage. Since metal lines are already embedded into the ULK, any shrinkage generates stress, potentially leading to stress migration failures. Also, variability in pattern density and consequent variability in shrinkage will cause the ULK to lose its planarity. As FIG. 5 indicates, both D and V bulbs result in about the same k recovery, while shrinkage is reduced more than half (to about 1%). Adding a 295 nm high pass filter, with D bulbs, results in the same k recovery of about 0.12, but shrinkage now being only 0.5%. This suggests that wavelengths greater than 300 nm are sufficient for moisture removal. But the same 295 nm filter with a V bulb, while bringing about even lower shrinkage, does not bring about the same level of k recovery. This suggests that significant intensity between 300 and 400 nm is helpful for k recovery.

These findings suggest that a exposure to UV radiation with a constrained spectral profile above 300 nm can bring about more k recovery than an anneal, while also avoiding significant shrinkage. This can be achieved with a suitable broad-band source (e.g., D or V bulbs), with or without filters. It can also potentially be done with single wavelength excimer sources between 300 and 400 nm or even UV LEDs (395 nm or 365 nm).

Pre-Metallization k Recovery Using UV Treatment

Figure 6:
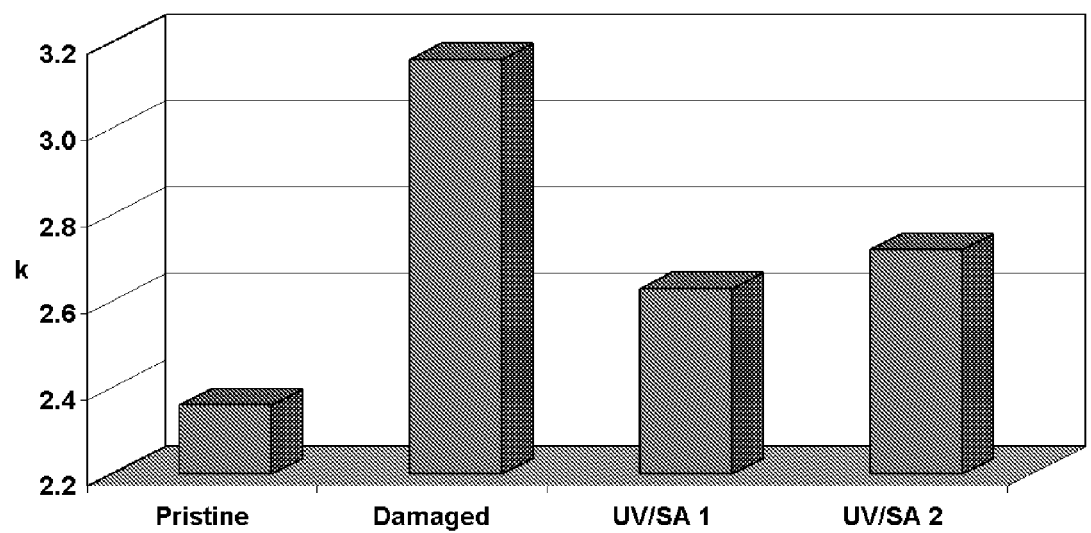

Treatments of pre-metallization plasma damaged carbon containing low-k dielectrics with UV treatments including a chemical silylation agent exposure in accordance with the present invention have been found to achieve k reductions of as much as 0.5 or more and to a k value of as low as 2.4 or lower. FIG. 6 depicts data from experiments in which a ULK CDO dielectric was damaged with an oxidizing plasma and then subjected to a UV treatment in accordance with the present invention. The UV treatment involved exposure to a first methyl silane silylating agent (SA1) followed by UV radiation exposure, and separately exposure to a second methyl silane silylating agent (SA2) followed by UV radiation exposure. The UV treatment in each case resulted in a dramatic reduction in the dielectric constant (k recovery) of the treated dielectric from greater than 3 to about 2.6 to 2.7. Similarly beneficial results were obtained with UV treatments involving UV radiation exposures before and after exposure to a silylating agent.

ALTERNATIVE EMBODIMENTS

Patterning Method/Apparatus

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

System Controller

Another aspect of the invention is an apparatus configured to accomplish the methods described herein. A suitable apparatus includes hardware for accomplishing the process operations and a system controller having instructions for controlling process operations in accordance with the present invention, such as described with reference to FIG. 3, above. The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

What is claimed is:

1. A method of forming a semiconductor device, comprising:

receiving in a processing chamber a semiconductor device substrate comprising a carbon-containing low-k dielectric having a first dielectric constant;

exposing the carbon containing low-k dielectric to a UV treatment, the treatment comprising at least one of:

(a) exposure to UV radiation having a spectral profile characterized by greater than 50% of the UV radiation power having a wavelength of greater than 300 nm; and (b) exposure to UV radiation and a chemical silylating agent;

such that the dielectric constant of the carbon-containing low-k dielectric is decreased to a second dielectric constant;

wherein the treatment comprises exposure to the chemical silylating agent prior to the UV radiation exposure; and
wherein a second UV radiation exposure precedes the exposing the carbon containing low-k dielectric to the chemical silylating agent.

2. The method of claim 1, wherein there is no air-break between exposures.

3. The method of claim 1, wherein there is an air-break between one or more exposures.

4. The method of claim 1, wherein a thermal anneal exposure precedes the exposing the carbon containing low-k dielectric to the chemical silylating agent.

5. The method of claim 1, wherein the dielectric is selected from the group consisting of carbon doped oxides formed from octamethyl cyclotetrasiloxane (OMCTS), tetramethylcyclotetrasiloxane (TMCTS), dimethyldimethoxysilane (DMDMOS), and diethoxymethylsilane (DEMS).

6. The method of claim 5, wherein the alkyl silane is selected from the group consisting of dimethyldichlorosilane, dimethyldimethoxysilane, dimethyldiethoxysilane, bis(dimethylamino)dimethylsilane, dimethylaminao trimethyl silane, bis(diethylamino)dimethylsilane, ethylmethyldichlorosilane and diethyldichlorosilane, diethyldiethoxysilane.

7. The method of claim 6, wherein the silylating agent is bis(dimethylamino)dimethylsilane.

8. The method of claim 6, wherein the silylating agent is dimethyldichlorosilane.

9. The method of claim 1, wherein greater than 50% of the (a) and/or (b) UV radiation power is in a wavelength range of about 300 to 450 nm.

10. The method of claim 1, wherein greater than 50% of the (a) and/or (b) UV radiation power is in a wavelength range of about 300 to 400 nm.

11. The method of claim 1, wherein less than 10% of the (a) and/or (b) UV radiation power is in a wavelength range below 300 nm.

12. The method of claim 1, wherein less than 5% of the (a) and/or (b) UV radiation power is in a wavelength range below 300 nm.

13. The method of claim 1, wherein less than 1% of the (a) and/or (b) UV radiation power is in a wavelength range below 300 nm.

14. The method of claim 1, wherein the proportion of (a) and/or (b) UV radiation power in a wavelength range of 200 to 240 nm to UV radiation power in a wavelength range of 300 to 400 nm in the UV radiation to which the carbon containing low-k dielectric is exposed is no more than 10%.

15. The method of claim 1, wherein a Fe-filled ("D") bulb is used a source for the (a) and/or (b) UV radiation.

16. The method of claim 15, wherein a high pass filter is used with the D bulb to filter out the UV radiation having a wavelength below 300 nm prior to exposure of the carbon containing low-k dielectric.

17. The method of claim 16, wherein the filter is a 295 nm high pass filter.

18. The method of claim 1, wherein a Ga-filled ("V") bulb is used a source for the (a) and/or (b) UV radiation.

19. The method of claim 18, wherein a high pass filter is used with the V bulb to filter out the UV radiation having a wavelength below 300 nm prior to exposure of the carbon containing low-k dielectric.

20. The method of claim 19, wherein the filter is a 295 nm high pass filter.

* * * * *